(12) United States Patent
Tseng et al.

(10) Patent No.: US 12,159,853 B2
(45) Date of Patent: Dec. 3, 2024

(54) PACKAGE STRUCTURE INCLUDING IPD AND METHOD OF FORMING THE SAME

(71) Applicant: Taiwan Semiconductor Manufacturing Company, Ltd., Hsinchu (TW)

(72) Inventors: Hua-Wei Tseng, New Taipei (TW); Yueh-Ting Lin, Taipei (TW); Shao-Yun Chen, Tao-yuan (TW); Li-Hsien Huang, Hsinchu County (TW); An-Jhih Su, Taoyuan (TW); Ming-Shih Yeh, Hsinchu County (TW); Der-Chyang Yeh, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/155,705

(22) Filed: Jan. 17, 2023

(65) Prior Publication Data
US 2023/0154881 A1    May 18, 2023

Related U.S. Application Data

(63) Continuation of application No. 17/185,970, filed on Feb. 26, 2021, now Pat. No. 11,587,900.

(51) Int. Cl.
*H01L 25/065*    (2023.01)
*H01L 23/00*    (2006.01)
*H01L 49/02*    (2006.01)

(52) U.S. Cl.
CPC .............. *H01L 24/24* (2013.01); *H01L 24/19* (2013.01); *H01L 24/82* (2013.01); *H01L 28/00* (2013.01); *H01L 25/0657* (2013.01); *H01L 2224/24101* (2013.01); *H01L 2224/24265* (2013.01); *H01L 2924/19011* (2013.01)

(58) Field of Classification Search
CPC ........................................................ H01L 28/00
See application file for complete search history.

(56) References Cited

U.S. PATENT DOCUMENTS

| 9,000,584 | B2 | 4/2015 | Lin et al. |
| 9,048,222 | B2 | 6/2015 | Hung et al. |
| 9,048,233 | B2 | 6/2015 | Wu et al. |

(Continued)

FOREIGN PATENT DOCUMENTS

CN    101026100 A  *  8/2007

*Primary Examiner* — Evan G Clinton
(74) *Attorney, Agent, or Firm* — JCIPRNET

(57) ABSTRACT

A package structure including IPD and method of forming the same are provided. The package structure includes a die, an encapsulant laterally encapsulating the die, a first RDL structure disposed on the encapsulant and the die, an IPD disposed on the first RDL structure and an underfill layer. The IPD includes a substrate, a first connector on a first side of the substrate and electrically connected to the first RDL structure, a guard structure on a second side of the substrate opposite to the first side and laterally surrounding a connector region, and a second connector disposed within the connector region and electrically connected to a conductive via embedded in the substrate. The underfill layer is disposed to at least fill a space between the first side of the IPD and the first RDL structure. The underfill layer is separated from the connector region by the guard structure.

20 Claims, 34 Drawing Sheets

(56) References Cited

U.S. PATENT DOCUMENTS

| | | |
|---|---|---|
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2005/0098893 A1* | 5/2005 | Tsutsue ............... H01L 23/5226 |
| | | 257/E23.142 |
| 2018/0226349 A1* | 8/2018 | Yu ........................ H01L 21/568 |
| 2019/0051621 A1* | 2/2019 | Liu ................... H01L 23/49838 |

* cited by examiner

PACKAGE STRUCTURE INCLUDING IPD AND METHOD OF FORMING THE SAME

CROSS-REFERENCE TO RELATED APPLICATION

This application is a continuation application of and claims the priority benefit of a prior application Ser. No. 17/185,970, filed on Feb. 26, 2021. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, integrated fan-out (InFO) packages, and so on.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
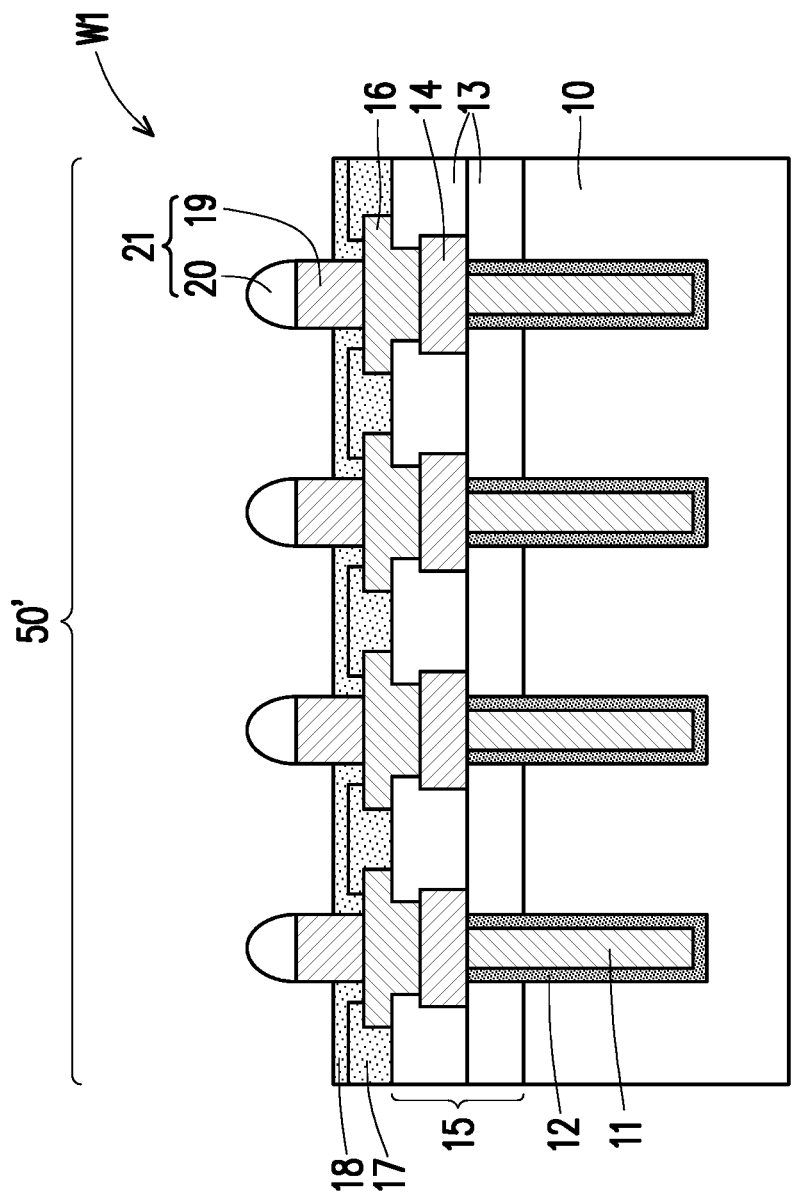
FIG. 1A to FIG. 1G are schematic cross-sectional views illustrating a method of forming an integrated passive device (IPD) according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIG.s. The spatially relative terms are intended to encompass different orientations of the device in use or operation in addition to the orientation depicted in the FIG.s. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1G are cross-sectional views illustrating a method of forming an integrated passive device (IPD) in accordance with some embodiments of the disclosure.

Referring to FIG. 1A, in some embodiments, a wafer W1 including a plurality of device regions is provided. The wafer W1 may be a semiconductor wafer, and a plurality of IPDs 50' are disposed within the device regions of the wafer W1. The plurality of IPDs 50' may be arranged in an array and spaced apart from each other by scribe regions therebetween. It is noted that, for the sake of brevity, one IPD 50' disposed in one device region of the wafer W1 is illustrated, but the disclosure is not limited thereto. The wafer W1 may include any suitable number of IPDs therein. In some embodiments, the IPDs 50' may also be referred to as initial IPDs. In some embodiments, the IPDs 50' include a plurality of passive devices and free of active devices.

In some embodiments, the IPD 50' may include a substrate 10, a plurality of conductive vias 11 embedded in the substrate 10, an interconnection structure 15 disposed over the substrate 10, a plurality of conductive pads 16 and connectors 21 disposed on the interconnection structure 15, and passivation layers 17 and 18. The substrate 10 may be a semiconductor substrate such as a silicon substrate or a semiconductor-on-insulator (SOI) substrate. In some embodiments, the substrate 10 is an undoped silicon substrate. However, the disclosure is not limited thereto. In alternative embodiments, the substrate 10 may be a doped silicon substrate. The doped silicon substrate may be P-type doped, N-type doped, or a combination thereof.

In some embodiments, a plurality of passive devices (not shown) are disposed on the substrate 10. The passive devices may include capacitors (e.g., deep-trench capacitors), resistors, inductors, the like, other suitable types of passive devices or combinations thereof.

The interconnection structure 15 is formed on the substrate 10, and may include multi-layers of dielectric layers 13 and conductive features 14 stacked on one another. It is noted that, the tiers of the dielectric layers 13 and the conductive features 14 shown in the figures are merely for illustration, and the disclosure is not limited thereto. The materials of the dielectric layers 13 may include silicon oxide, silicon nitride, silicon oxynitride, undoped silicate glass (USG), phosphosilicate glass (PSG), borosilicate glass (BSG), boron-doped phosphosilicate glass (BPSG), the like or combinations thereof. The conductive features 14 are embedded in the dielectric layers 13, and may include multi-layers of conductive lines and conductive vias (not shown) electrically connected to each other. The conductive features 14 may also be referred to as interconnect wirings, which are electrically connected to the passive devices formed on the substrate 10. The conductive features 14 may include suitable conductive materials, such as metal, metal alloy or a combination thereof. For example, the conductive material may include tungsten (W), copper (Cu), copper alloys, aluminum (Al), aluminum alloys, or combinations thereof. It is noted that, for the sake of brevity, one tier of the conductive features 14 included in the interconnection structure 15 is illustrated. It should be understood that, the interconnection structure 15 may include more tiers of conductive features that may be disposed over and/or below the illustrated conductive features 14.

The conductive vias 11 are embedded in the substrate 10 and electrically connected to the conductive features 14 of the interconnection structure 15. The conductive vias 11 may extend into the interconnection structure 15 to be in physical and electrical contact with the conductive features of the interconnection structure 15. For example, the conductive vias 11 may be connected to conductive features at a bottom (e.g., bottommost) tier of multi-layers of the conductive features included in the interconnection structure 15, but the disclosure is not limited thereto.

In some embodiments, the conductive vias 11 have dielectric liners 12 covering surfaces thereof. The dielectric liner 12 is disposed between the respective conductive via 11 and the substrate 10 to separate the respective conductive via 11 from the substrate 10. In some embodiments, the dielectric liner 12 may also be disposed between the respective conductive via 11 and the dielectric layer 13. The dielectric liner 12 may surround the sidewalls and bottom surface of the conductive via 11. The conductive via 11 may include copper, copper alloys, aluminum, aluminum alloys, Ta, TaN, Ti, TiN, CoW or combinations thereof. The dielectric liner 12 includes a suitable dielectric material, such as silicon oxide, silicon nitride, silicon oxynitride or the like, or combinations thereof.

The conductive pads 16 may be or electrically connected to a top (e.g., topmost) conductive feature of the interconnection structure 15, and further electrically connected to the passive devices formed on the substrate 10 through the interconnection structure 15. The material of the conductive pads 16 may include metal or metal alloy, such as aluminum, copper, nickel, or alloys thereof, or the like.

The passivation layer 17 is formed over the substrate 10 and partially covers the conductive pads 16. In some embodiments, the passivation layer 17 has a plurality of openings each exposing a corresponding conductive pad 16.

The passivation layer 18 is disposed on the passivation layer 17 and may partially fill into the openings of the passivation layer 17 and cover portions of the top surfaces of the conductive pads 16. In some embodiments, the passivation layer 18 may also be referred to as a post-passivation layer. The passivation layers 17 and 18 may include insulating materials such as silicon oxide, silicon nitride, polymer, or a combination thereof. The polymer may include polybenzoxazole (PBO), polyimide (PI), benzocyclobutene (BCB), the like, or combinations thereof. The materials of the passivation layers 17 and 18 may be the same or different. Portions of the conductive pads 16 are exposed by the passivation layers 17 and 18 for external connection.

The connectors 21 are disposed on the conductive pads 16 exposed by the passivation layers 17 and 18. In other words, the connectors 21 penetrate through the passivation layers 18 and 17 to electrically connect to the conductive pads 16. In some embodiments, the connectors 21 may each include a conductive post 19 and a conductive cap 20 disposed on the conductive post 19. The conductive posts 19 may include gold bumps, copper bumps, copper posts, copper pillars, or the like or combinations thereof. The conductive caps 20 may include solder caps, solder balls or the like. Other suitable metallic cap may also be used. The conductive posts 19 land on the conductive pads 16 and may be laterally covered by the passivation layer 18. In some embodiments, lower portions of the sidewalls of the conductive posts 19 are covered by the passivation layer 18, while upper portions of the sidewalls of the conductive posts 19 are exposed. It is noted that, the numbers of the conductive vias 11, the conductive pads 16 and the connectors 21 shown in the figures are merely for illustration, and the disclosure is not limited thereto.

Figure 1B:
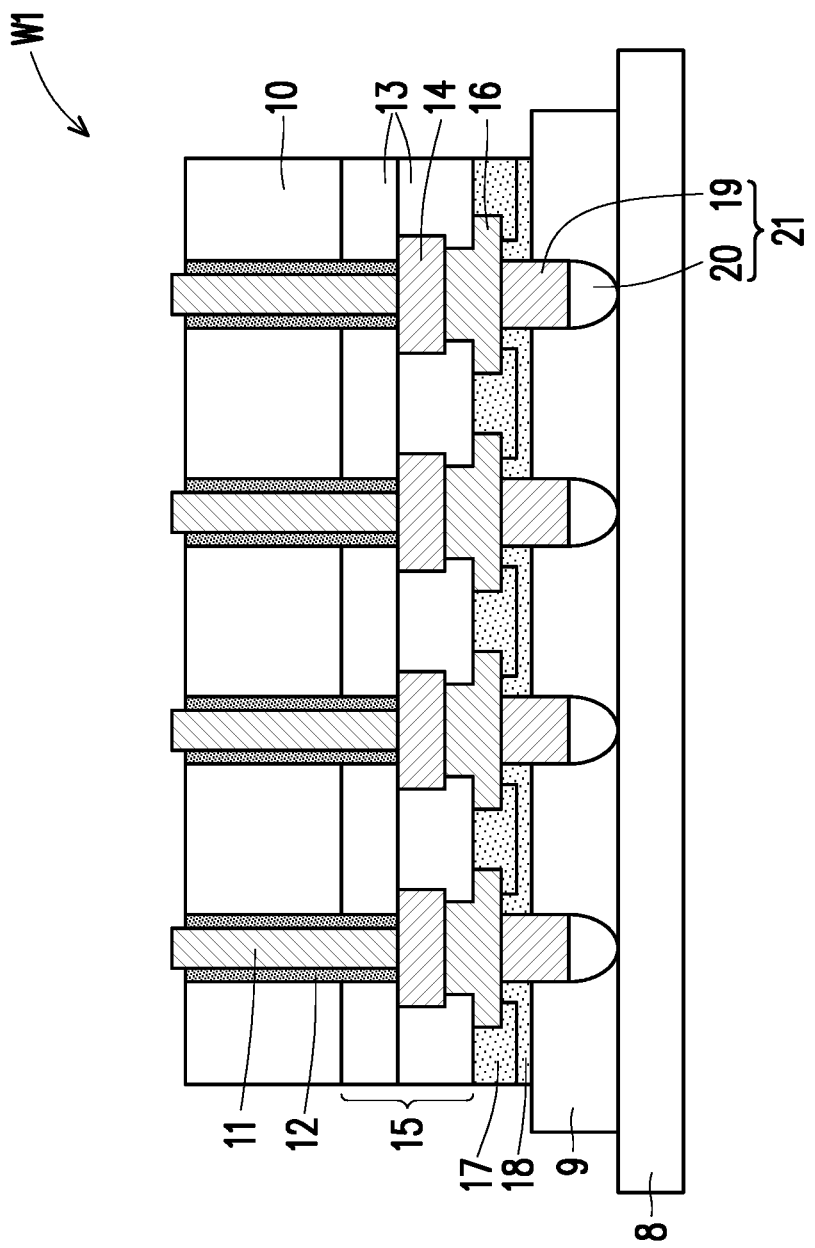

Referring to FIG. 1A and FIG. 1B, in some embodiments, the wafer W1 is flipped upside down and disposed on a carrier 8. The carrier 8 may be a glass carrier, a ceramic carrier, or the like. In some embodiments, the wafer W1 is attached to the carrier 8 through an adhesive layer 9, which may be an adhesive tape, die attach film, or the like. In an embodiment, the adhesive layer 9 may include an ultra-violet glue, which loses its adhesive properties when exposed to ultra-violet light. However, other types of adhesives, such as pressure sensitive adhesives, radiation curable adhesives, epoxies, combinations of these, or the like, may also be used.

In some embodiments, portions of the substrate 10 and the dielectric liner 12 are removed to expose the conductive vias 11. For example, after the wafer W1 is mounted to the carrier 8, the conductive vias 11 faces up, a planarization process may be performed to remove portions of the substrate 10 and the dielectric liner 12 covering the top surfaces of the conductive vias 11. The planarization process may include a chemical mechanical polishing (CMP) process, for example. Thereafter, the substrate 10 may be further recessed, such that the conductive vias 11 protrude from the top surface of the substrate 10. In some embodiments, the dielectric liner 12 may also be recessed along with the substrate 10. For example, a portion of the substrate 11 and/or portions of the dielectric lines 12 laterally aside top portions of the conductive vias 11 may be removed by an etching process, such as wet etching process, dry etching process, or a combination thereof. As such, the conductive vias 11 penetrate through the substrate 10, and may also be referred to as through substrate vias (TSVs).

Figure 1C:
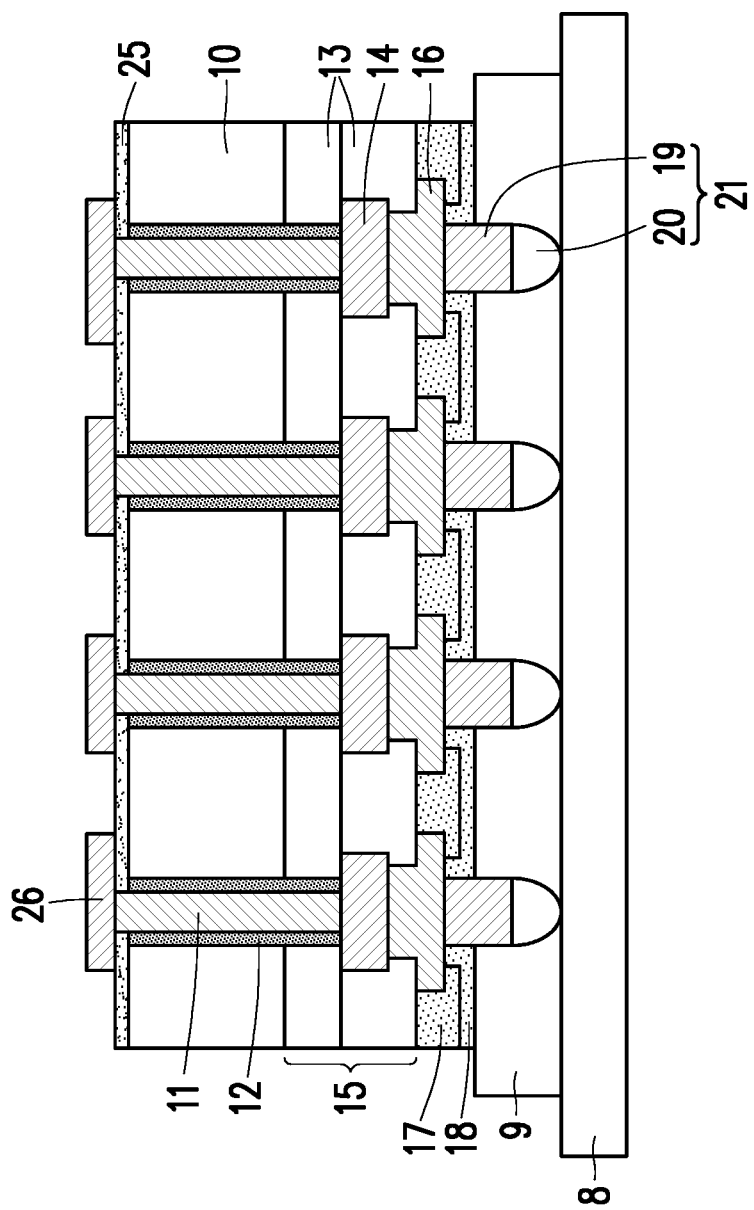

Referring to FIG. 1C, an isolation layer 25 is disposed on the substrate 10 and laterally aside the conductive vias 11. The isolation layer 25 may include a dielectric material such as silicon nitride, although other dielectric materials such as silicon oxide, silicon carbide, silicon nitride, silicon oxynitride, oxygen-doped silicon carbide, nitrogen-doped silicon carbide, a polymer, which may be a photo-sensitive material such as PBO, polyimide, or BCB, a low-K dielectric material such as PSG, BPSG, FSG, $SiO_xC_y$, SOG, spin-on polymers, silicon carbon material, compounds thereof, composites thereof, combinations thereof, or the like may also be used for the isolation layer 25. In some embodiments, the isolation layer 25 may be formed by forming an isolation material layer on the substrate 10 to cover sidewalls and top surfaces of the protruding portions of the TSVs 11 over the top surface of the substrate 10. The isolation material layer may be formed using a suitable deposition process, such as CVD, atomic layer deposition (ALD), or the like. In some embodiments, the isolation material layer may be a conformal layer. Thereafter, a planarization process, such as a CMP process is performed to remove excess portions of the isolation material layer over the top surfaces of the TSVs 11, such that the top surfaces of the TSVs 11 are revealed. In some embodiments, the top surfaces of the TSVs 11 and the top surface of the isolation layer 25 are substantially coplanar or level with each other.

Still referring to FIG. 1C, thereafter, a redistribution layer (RDL) 26 is then formed on the isolation layer 25 to electrically connect to the TSVs 11. The redistribution layer 26 includes conductive materials, which may include metal and/or metal alloy, such as copper, aluminum, nickel, titanium, alloys thereof, or the like, or combinations thereof. The formation of the redistribution layer 26 may include PVD, plating such as an electroplating process, or combinations thereof. In some embodiments, the redistribution layer 26 includes a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may include copper or other suitable metallic materials.

Figure 1D:
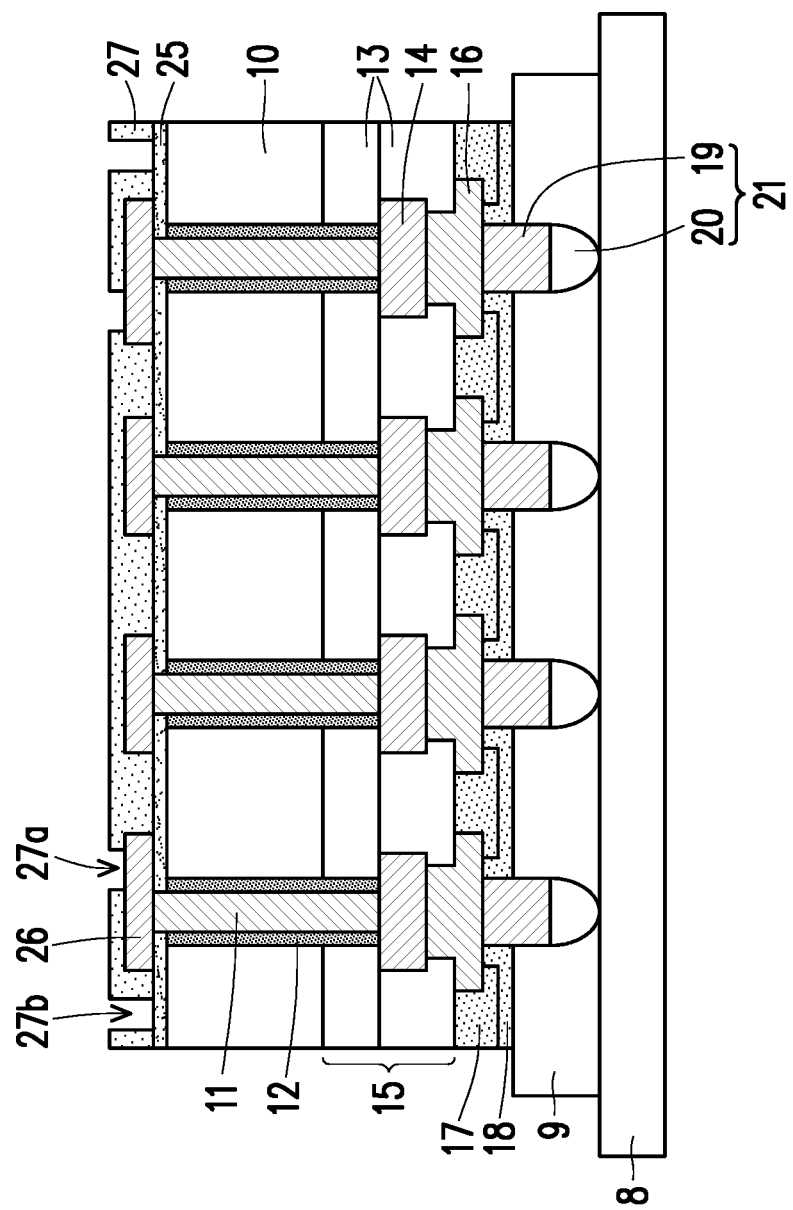

Referring to FIG. 1D, a dielectric layer 27 is formed on the isolation layer 25 to cover the isolation layer 25 and the redistribution layer 26. In some embodiments, the dielectric layer 27 includes a polymer material and may also be referred to as a polymer layer. For example, the polymer material may include a photo-sensitive material such as polybenzoxazole (PBO), polyimide (PI), benzocyclobutene (BCB), combinations thereof or the like. Alternatively or additionally, the dielectric layer 27 may include an inorganic dielectric material such as silicon oxide, silicon nitride, silicon oxynitride, or the like, or combinations thereof. The forming method of the dielectric layer 27 may include suitable fabrication techniques such as spin coating, chemical vapor deposition (CVD), plasma-enhanced chemical vapor deposition (PECVD), lamination or the like.

In some embodiments, the dielectric layer 27 is patterned to form a plurality of openings 27a and 27b. During the patterning process, portions of the dielectric layer 27 directly on the redistribution layer 26 are removed to form the openings 27a, such that the openings 27a expose portions of the top surfaces of the redistribution layer 26; and portions of the dielectric layer 27 directly on the isolation layer 25 are removed to form the openings 27b, such that the openings 27b expose portions of the top surfaces of the isolation layer 25. In other words, the openings 27b extend from a top surface of the dielectric layer 27 to a top surface of the isolation layer 25. However, the disclosure is not limited thereto. In alternative embodiments, the openings 27b may extend from the top surface of the dielectric layer 27 downward to a point in the dielectric layer 27 and over the isolation layer 25, without exposing the top surface of the isolation layer 25. In some embodiments, the patterning of the dielectric layer 27 may include laser drilling process, photolithography and etching processes, or the like.

Figure 1E:
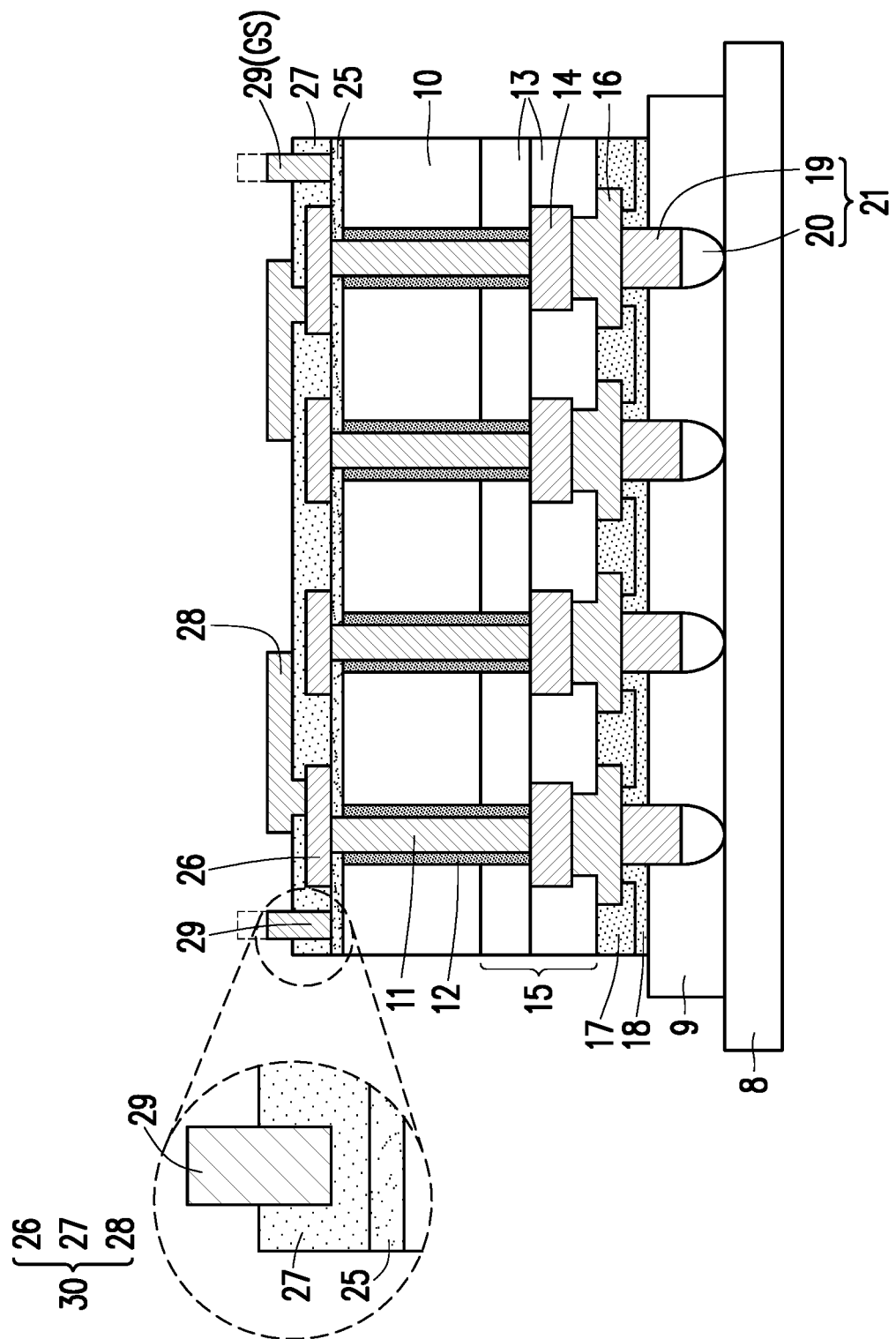

Referring to FIG. 1D and FIG. 1E, a redistribution layer 28 and a dam structure 29 are formed over the substrate 10. In some embodiments, the redistribution layer 28 and the dam structure 29 are formed simultaneously using the same material. For example, the redistribution layer 28 and the dam structure 29 may respectively include a conductive material, which may include metal and/or metal alloy, such as copper, aluminum, nickel, titanium, alloys thereof, or the like, or combinations thereof. In some embodiments, each of the redistribution layer 28 and the dam structure 29 includes a seed layer and a metal layer on the seed layer (not shown). The seed layer may be a metal seed layer such as a copper seed layer. In some embodiments, the seed layer includes a first metal layer such as a titanium layer and a second metal layer such as a copper layer over the first metal layer. The metal layer may include copper or other suitable metallic materials.

The redistribution layer 28 fills into the openings 27a of the dielectric layer 27 to electrically connect to the redistribution layer 26. The dam structure 29 may fill into the openings 27b of the dielectric layer 27 and land on the isolation layer 25. In other words, the redistribution layer 28 penetrates through the dielectric layer 27 to land on and electrically connect to the redistribution layer 26. The dam structure 29 may penetrate through the dielectric layer 27 to land on the isolation layer 25. The sidewalls of lower portion of the dam structure 29 is surrounded by the dielectric layer 27, while the bottom surface of the dam structure 29 is in contact with the isolation layer 25. In alternative embodiments in which the openings 27b do not expose the isolation layer 25, as shown in the enlarged view, the bottom surface and sidewalls of the lower portion of the dam structure 29 may be surrounded by and in contact with the dielectric layer 27, and the bottom surface of the dam structure 29 may be separated from the isolation layer 25 by a portion of the dielectric layer 27 therebetween. In the embodiments, the dam structure 29 is formed of a conductive material, and may be electrically floating. In other words, the dam structure 29 is electrically isolated from other conductive component (e.g., redistribution layer 28 and 26) included in the structure.

In some embodiments, the formation of the redistribution layer 28 and the dam structure 29 may include the following processes. After the openings 27a and 27b are formed, a seed material layer is formed on the dielectric layer 27 and lining the surfaces of the openings 27a and 27b. Thereafter, a patterned mask layer may be formed on the dielectric layer 27 for defining the redistribution layer 28 and the dam structure 29. The patterned mask layer may have first openings exposing portions of the seed material layer at the intended locations for the redistribution layer 28, and second openings exposing portions of the seed material layer at the intended locations for the dam structures 29. Thereafter, conductive materials are formed on the seed material layer within the first openings and second openings of the patterned mask layer by electroplating, for example. The patterned mask layer is then removed by an ashing process or stripping process, for example. The seed material layer previously covered by the patterned mask layer is removed by an etching process using the conductive material as an etching mark. As such, portions of the conductive material and underlying seed layer constitute the redistribution layer 28, while the other portions of the conductive material and underlying seed layer constitute the dam structure 29. The process for forming the redistribution layer 28 and the dam structure 29 described above is merely for illustration, and the disclosure is not limited thereto. Alternatively, the redistribution layer 28 and the dam structure 29 may be formed separately, and different patterned masks may be used for defining the redistribution layer 28 and the dam structure 29.

Referring to FIG. 1E, in some embodiments, the dam structure 29 protrudes from the top surface of the dielectric layer 27, and the top surface of the dam structure 29 may be located at a level height at least not lower than that of the top surface of the redistribution layer 28. For example, the top surface of the dam structure 29 may be higher than the top surface of the redistribution layer 28, as shown in the dotted line. In alternative embodiments, the top surface of the dam structure 29 may be substantially level with the top surface of the redistribution layer 28. In other words, the height of the dam structure 29 is higher than or at least equal to the height of the redistribution layer 28. Herein, the heights of the dam structure 29 and the redistribution layer 28 are defined by vertical distances from the top surfaces of the dam structure 29 and the redistribution layer 28 to the top surface of the isolation layer 25 (or the top surface (i.e., back surface) of the substrate 10) along a direction perpendicular to the top surface of the isolation layer 25 or the substrate 10, respectively.

In some embodiments, the dielectric layer 27 and the redistribution layers 26 and 28 constitute a RDL structure 30. However, the numbers of the dielectric layer and redistribution layers included in the RDL structure 30 are not limited thereto. More or less dielectric layers and/or redistribution layers may be used to form the RDL structure 30. In some embodiments in which the RDL structure 30 includes a plurality of dielectric layers, the dam structure 29 may partially or completely penetrate trough one or more dielectric layer of the RDL structure 30.

In the present embodiments, the dam structure 29 is disposed on and partially embedded in the dielectric layer 27 and electrically isolated from the redistribution layers 26 and 28 of the RDL structure 30. In some embodiments, a portion (e.g., lower portion) of the dam structure 29 is embedded in and laterally surrounded by the dielectric layer 27, while the other portion (e.g., upper portion) of the dam structure 29 vertically protrudes from the top surface of the dielectric layer 27. In some embodiments, the lower portion of the dam structure 29 embedded in the dielectric layer 27 and the upper portion of the dam structure 29 protruded above the dielectric layer 27 may have substantially the same width, and the topmost surface of the dielectric layer 27 may be not covered by the dielectric layer 27. In some other embodiments, the upper portion of the dam structure 29 over the top surface of the dielectric layer 27 may have a width larger than the wider of the lower portion of the dam structure 29 embedded in the dielectric layer 27, and a portion of the top surface of the dielectric layer 27 may be covered by the upper portion of the dam structure 29.

Figure 1F:
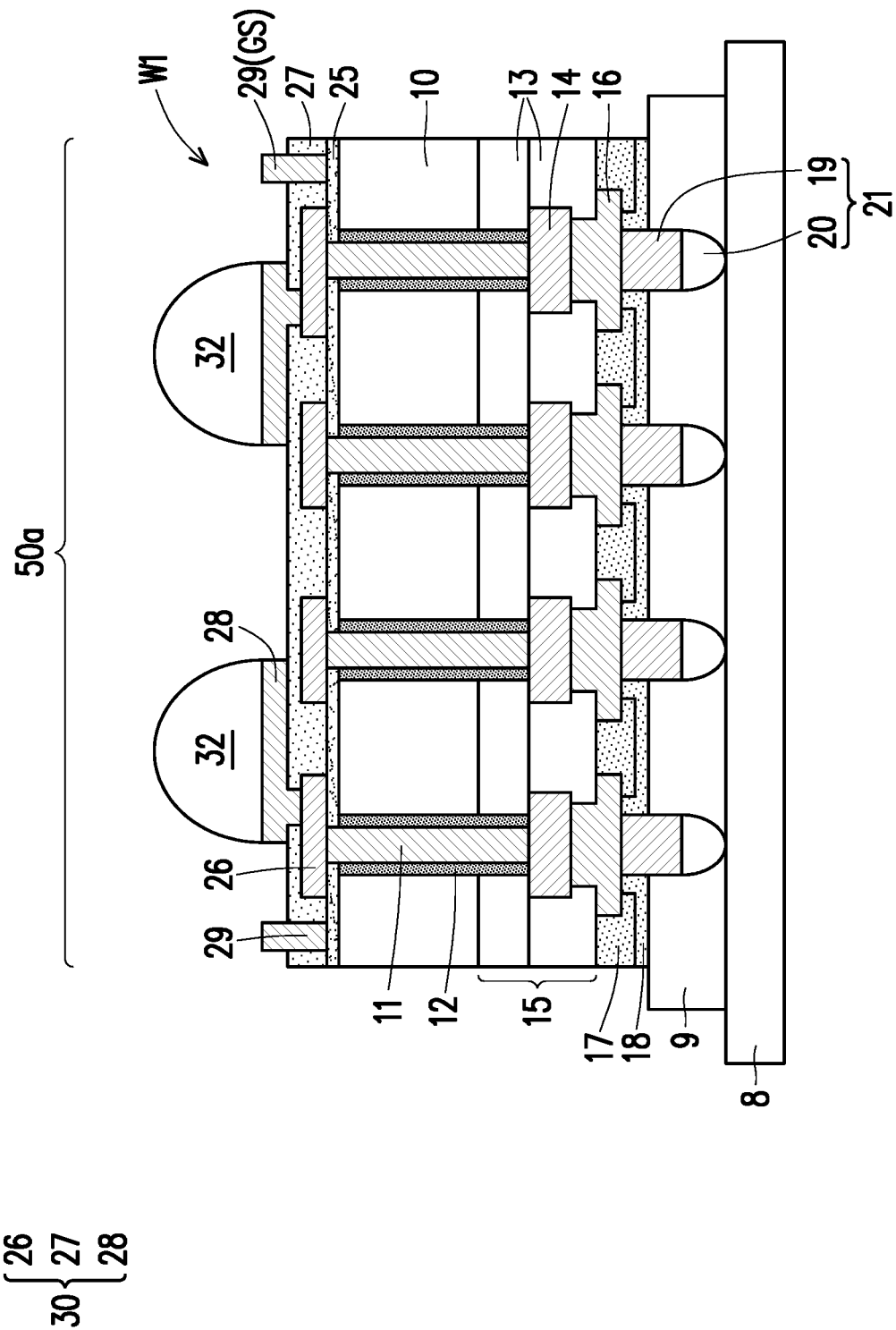

Referring to FIG. 1F, a plurality of connectors 32 are then formed on and electrically connected to the redistribution layer 28 of the RDL structure 30. The connectors 32 may include the ball grid array (BGA) connectors, solder balls, controlled collapse chip connection (C4) bumps, or a combination thereof. In some embodiments, the material of the connector 32 includes copper, aluminum, lead-free alloys (e.g., gold, tin, silver, aluminum, or copper alloys) or lead alloys (e.g., lead-tin alloys). The connector 32 may be formed by a suitable process such as evaporation, plating, ball dropping, screen printing and reflow process, a ball mounting process or a C4 process. As such, a wafer W1 including a plurality of IPDs 50a are formed over the carrier 8.

Figure 1G:
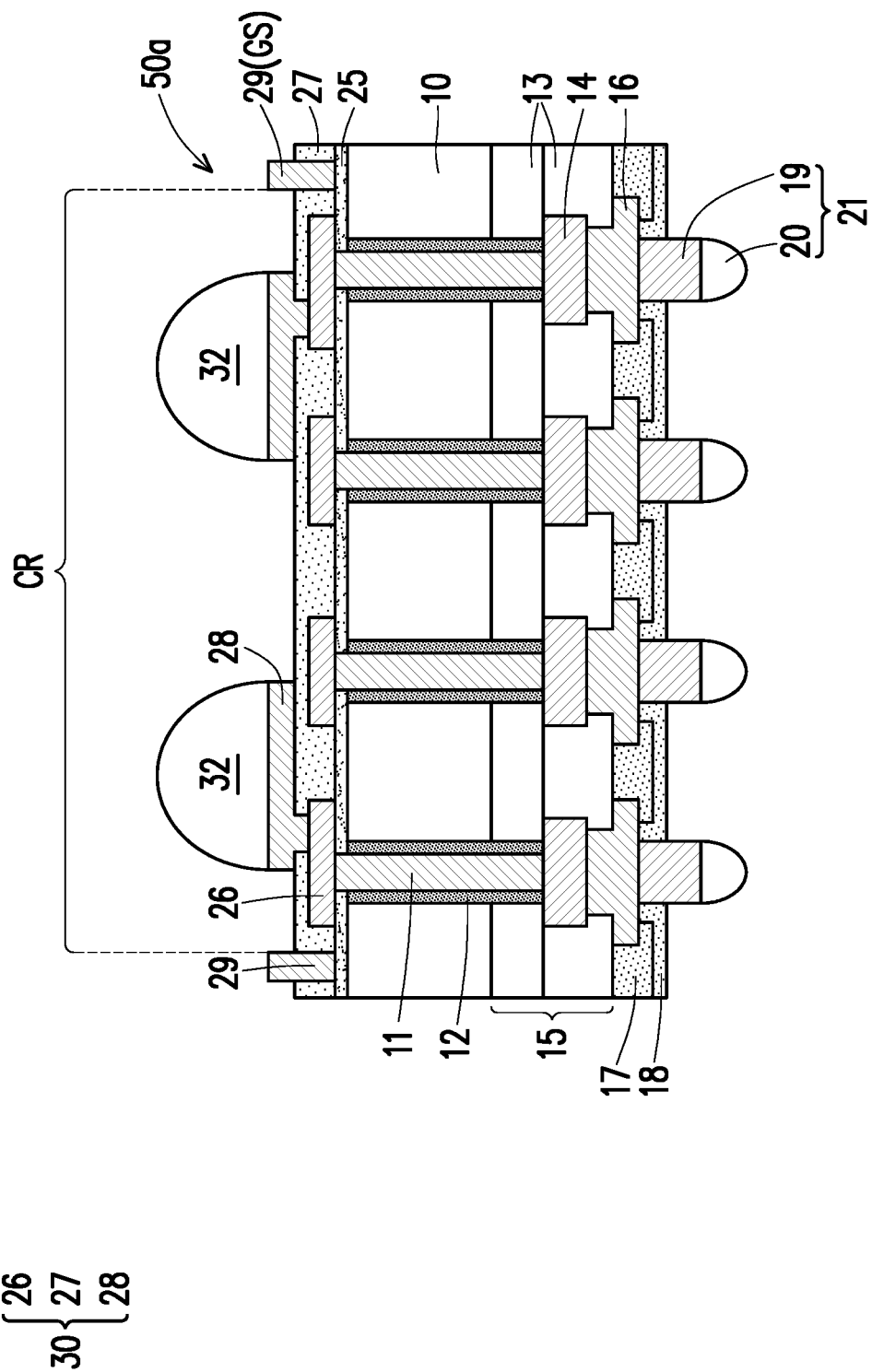

Referring to FIG. 1F and FIG. 1G, in some embodiments, the tape 9 may be de-bonded from the wafer W1, and the carrier 8 is then released from the wafer W1 including the IPDs 50a. Thereafter, a singulation process may be performed on the wafer W1 along scribe lines/regions (not shown) to singulate the IPDs 50a. The singulation process may include a mechanical saw process, laser dicing process, or the like, or combinations thereof.

Referring to FIG. 1G, the formation of the IPD 50a is thus completed. In some embodiments, the IPD 50a includes the substrate 10, the interconnection structure 15, the conductive pads 16, the passivation layers 17 and 18, the connectors 21, the RDL structure 30, the dam structure 29 and the connectors 32. The interconnection structure 15, the conductive pads 16 and the connectors 21 are disposed on front-side of the substrate 10, and the RDL structure 30 and the connectors 32 are disposed on back-side of the substrate 10. The connectors 21 and 32 may also be referred to as conductive terminals of the IPD 50a, which are used for further electrical connection. In some embodiments, the side of the IPD 50a including or close to the interconnection structure 15, the conductive pads 16 and the connectors 21 may also be referred to as "front side" of the IPD 50a, while the side of the IPD 50a opposite to the front side and including the RDL structure 30 and the connectors 32 may also be referred to as "back side" of the IPD 50a. In the embodiments, since the IPD 50a include connectors 21 and 32 disposed on both front-side and back side thereof, the IPD 50a may also be referred to as a dual-side IPD. The dam structure 29 is disposed at back side of the IPD 50a. Specifically, the dam structure 29 is disposed in and on the dielectric layer 17 of the RDL structure 30, and laterally aside the connectors 32.

Figure 2A:
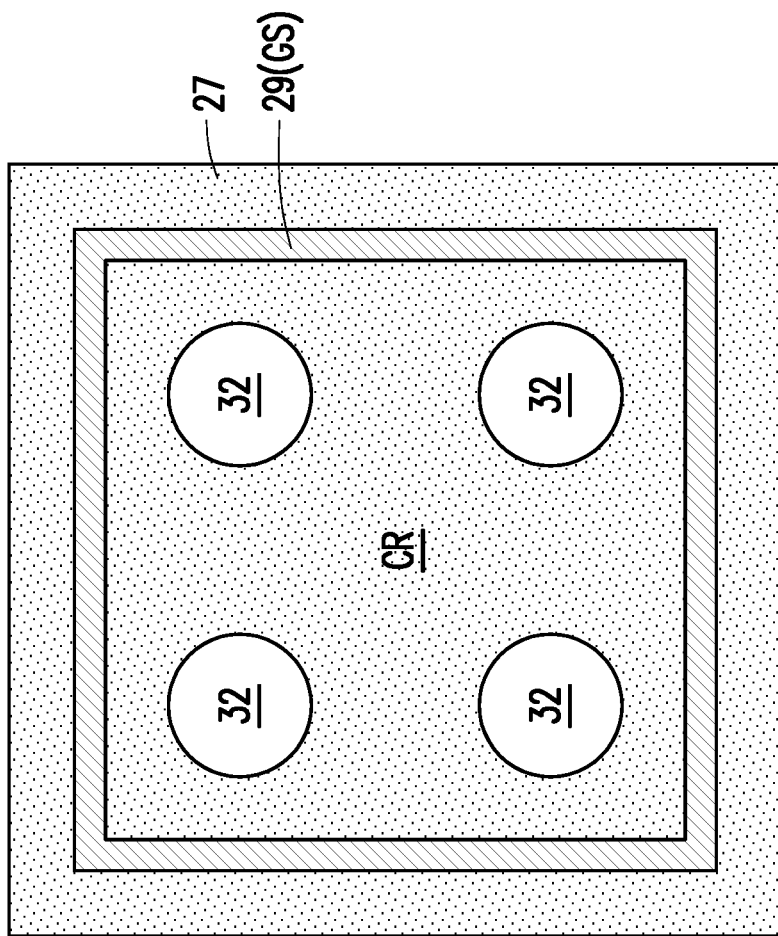
FIG. 2A to FIG. 2D are top views of IPDs illustrating various configurations of guard structure according to some embodiments of the disclosure.

FIG. 2A illustrates a top view of the IPD 50a. For the sake of brevity, merely the dielectric layer 27, the dam structure 29 and the connectors 32 are shown in the top view. As shown in FIG. 1G and FIG. 2A, the dam structure 29 is disposed on the back side of the IPD 50a and laterally surround a connector region CR within which the connectors 32 are disposed. The dam structure 29 serves as a guard structure GS for protecting the connector region CR from being contaminated in subsequent packaging process. In some embodiments, the top surface of the dam structure 29 may be lower than the topmost surface of the connector 32. In some other embodiments, the top surface of the dam structure 29 may be substantially level with or higher than the topmost surface of the connector 32.

Referring to FIG. 2A, in some embodiments, the dam structure 29 is ring-shaped, such as square ring-shaped, but the disclosure is not limited. In alternative embodiments, the dam structure 29 may be rectangular ring-shaped, circular ring-shaped, oval ring-shaped, or other suitable types of the ring-shaped. In some embodiments, the dam structure 29 forms a guard ring laterally surrounding the connector region CR and laterally spaced apart from the connectors 32. The connector region CR may be defined by inner sidewalls of the dam structure 29.

Figure 2B:
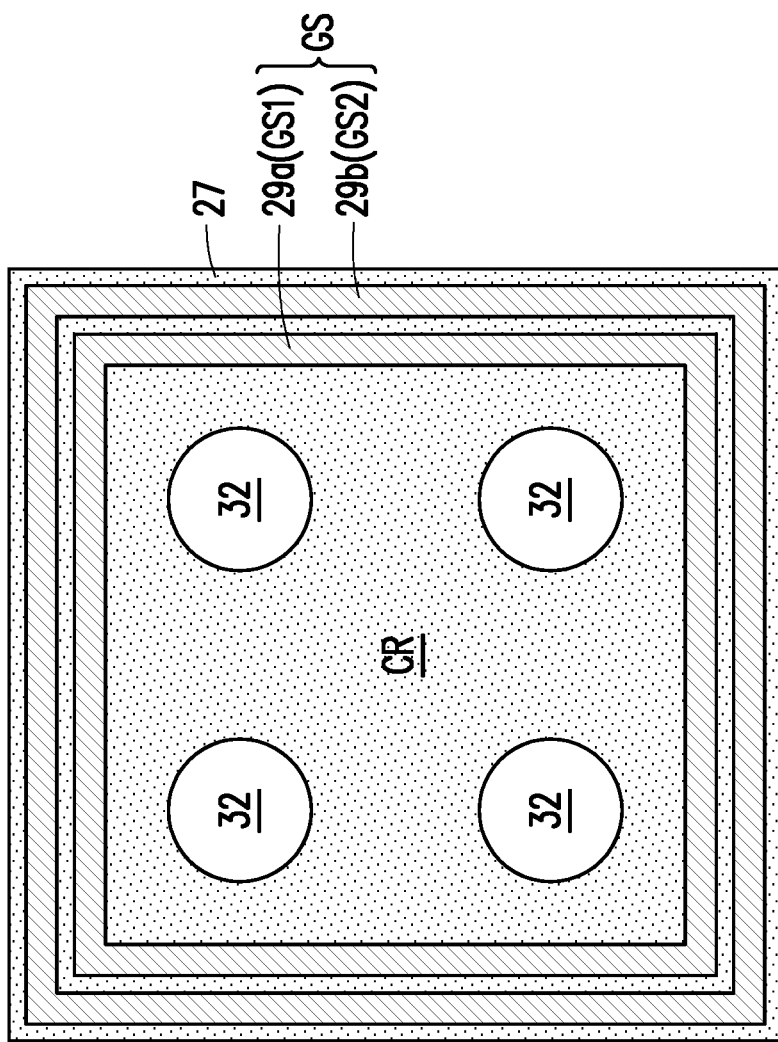
Figure 2C:
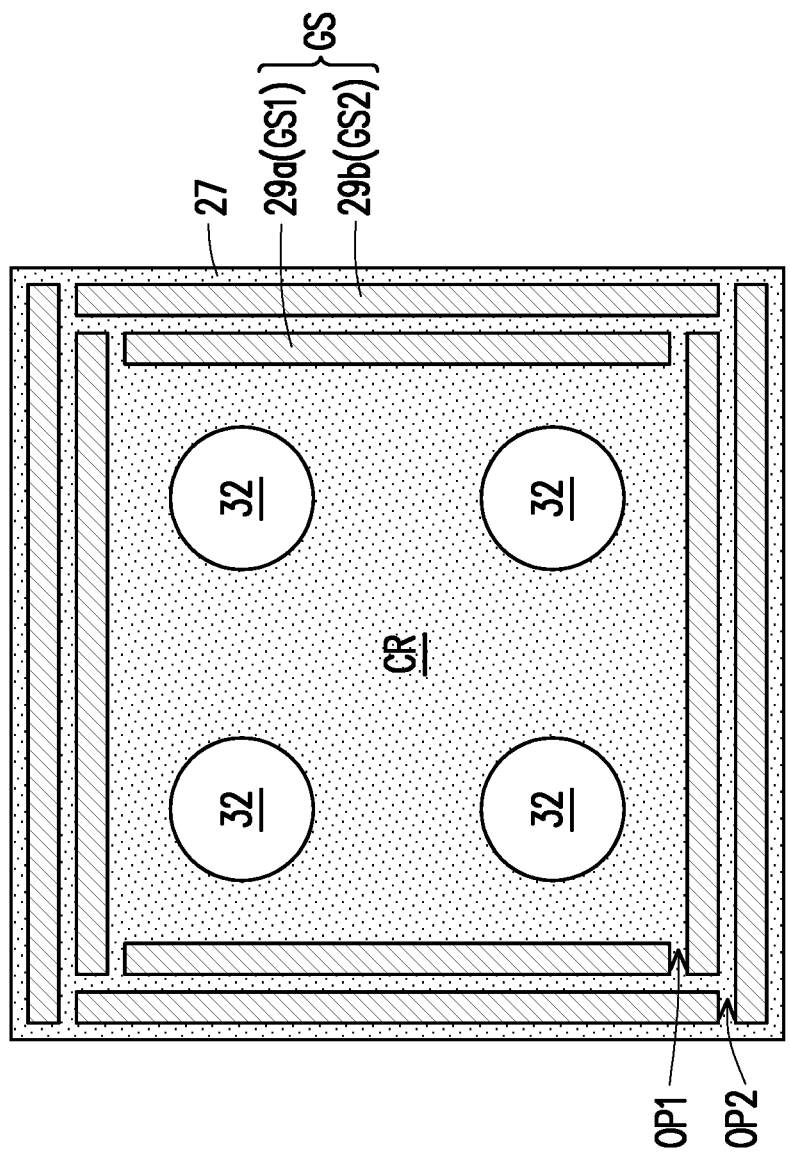
Figure 2D:
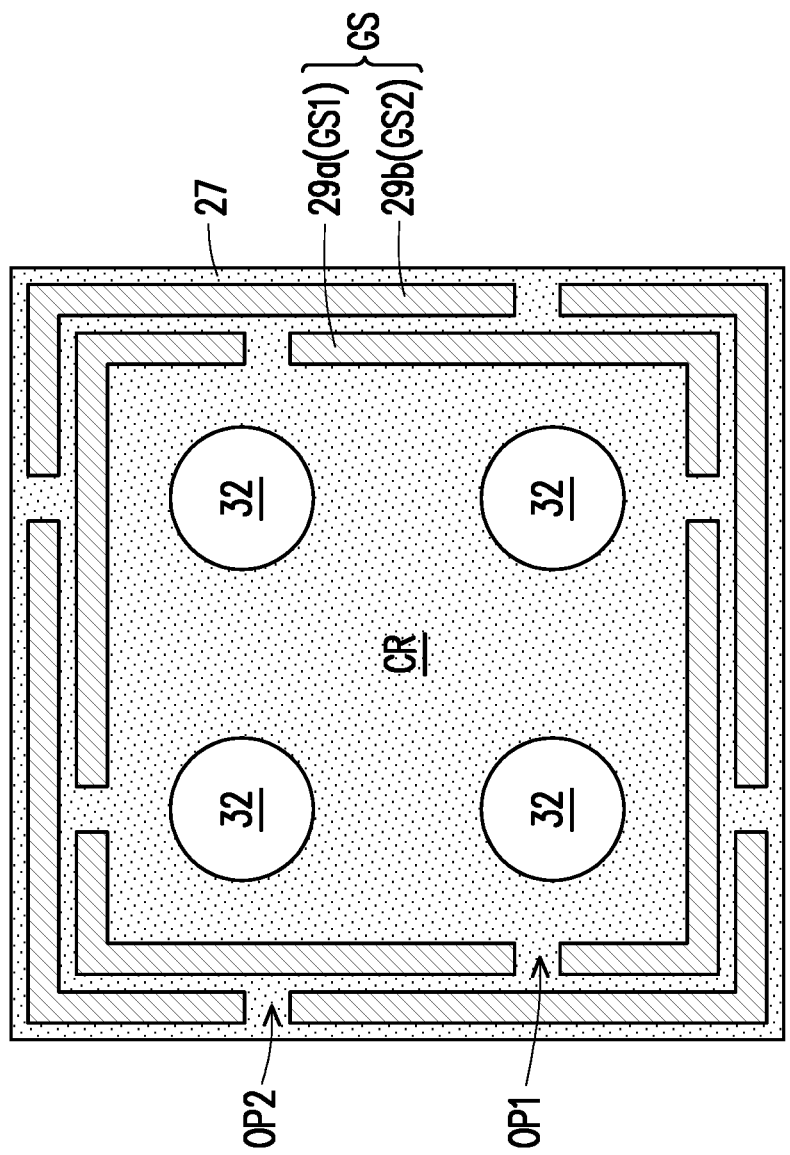

FIG. 2B to FIG. 2D illustrate top views of the IPD 50a according to some alternative embodiments of the disclosure.

Referring to FIG. 2B, in some embodiments, the guard structure GS may include a plurality of guard rings formed by a plurality of dam structures. For example, the guard structure GS may include a first guard ring GS1 constituted by a first dam structure 29a and a second guard ring GS2 constituted by a second dam structure 29b. The first dam structure 29a and the second dam structure 29b are ring-shaped and laterally surround the connectors 32 in the connector region CR. Herein, "ring-shaped" may include square ring-shaped, rectangular ring-shaped, circular ring-shaped, oval ring-shaped, or any other suitable types of ring-shaped. The first guard ring GS1 laterally surrounds the connector region CR and is laterally spaced apart from the connectors 32. The connector region CR may be defined by the inner sidewalls of the first guard ring GS1. The second guard ring GS2 laterally surrounds the first guard ring GS1. The first guard ring GS1 and the second guard ring GS2 may be laterally spaced apart from each other by a portion of the dielectric layer 27 disposed therebetween. The heights, widths and shapes of the first dam structure 29a and the second dam structure 29b may be the same or different. For example, the height of the first guard ring 29a may be larger than, equal to or lower than the height of the second guard ring 29b. It is noted that, the number of the guard rings included in the guard structure GS shown in the figures is merely for illustration, and the disclosure is not limited thereto. In alternative embodiments, the guard structure GS may include more than two guard rings, and the number of guard rings is not limited in the disclosure.

In the above embodiments, the guard rings of the guard structure GS are close ring-shaped. However, the disclosure is not limited thereto. In some other embodiments, one or more of the guard rings of the guard structure GS may be open ring-shaped. For example, as shown in FIG. 2C and FIG. 2D, the guard rings GS1 and GS2 of the guard structure GS may be constituted by open ring-shaped dam structures 29a and 29b. In some embodiments, the dam structures 29a and 29b may each include a plurality of non-continuous sections constituting an open ring-shaped structure or the like. In other words, the ring-shaped dam structure 29a and 29b (or the guard rings GS1 and GS2) include one or more openings. In some embodiments, the openings in different dam structures are staggered with each other. For example, the openings OP1 of the dam structure 29a are staggered with the openings OP2 of the dam structure 29b. In some other embodiments in which the guard structure GS includes a plurality of guard rings, one or some of the guard rings may be close ring-shaped, while the other one or some of the guard rings may be open ring-shaped.

It is noted that, the configurations of the guard structure GS illustrated in the figures are merely for illustration, and the disclosure is not limited thereto. The guard structure GS may have any suitable configuration and may be configured as any suitable shape, as long as the guard structure GS can protect the connectors in connector region from being contaminated during the subsequent packaging process.

In the foregoing embodiments, the dam structure 29 and the redistribution layer 28 are formed of a same conductive material, but the disclosure is not limited thereto. In alternative embodiments, the dam structure 29 may be formed of material(s) different from that of the redistribution layer 28, and the material of the dam structure 29 is not limited to conductive material. For example, the dam structure 29 may also include dielectric material, polymer material, semiconductor material or other suitable types of material which can stand over the substrate 10 and serve as the guard ring to protect the connect region. Furthermore, the forming method of the dam structure 29 is not limited to deposition and/or plating process. In some other embodiments, the dam structure may be pre-formed and then attached to the dielectric layer 27 of the RDL structure 30 through adhesive layer, for example. In such embodiments, the dam structure is not embedded in the dielectric layer 27, and the whole dam structure is disposed over the top surface of the dielectric layer 27. Alternatively, the dam structure may be formed by lamination or other suitable techniques.

Figure 3A:
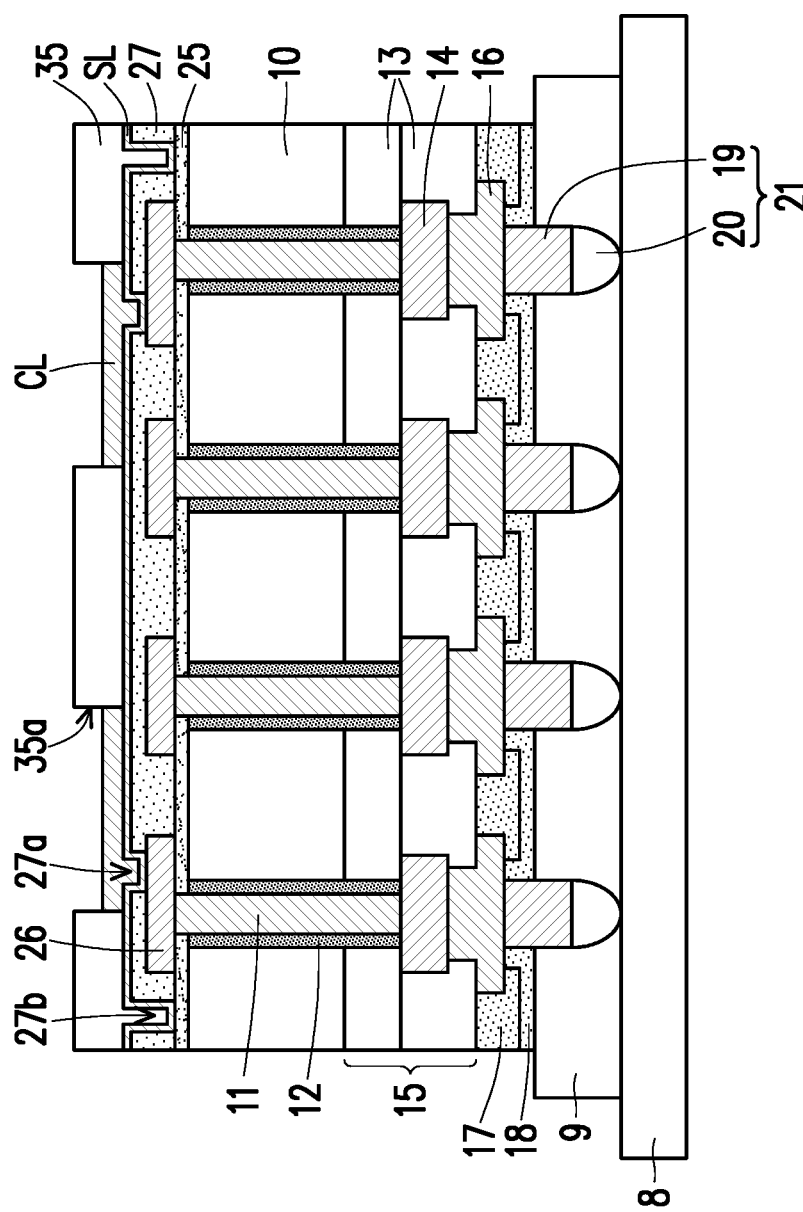
FIG. 3A to FIG. 3C are schematic cross-sectional views illustrating a method of forming an IPD according to some alternative embodiments of the disclosure.
Figure 3B:
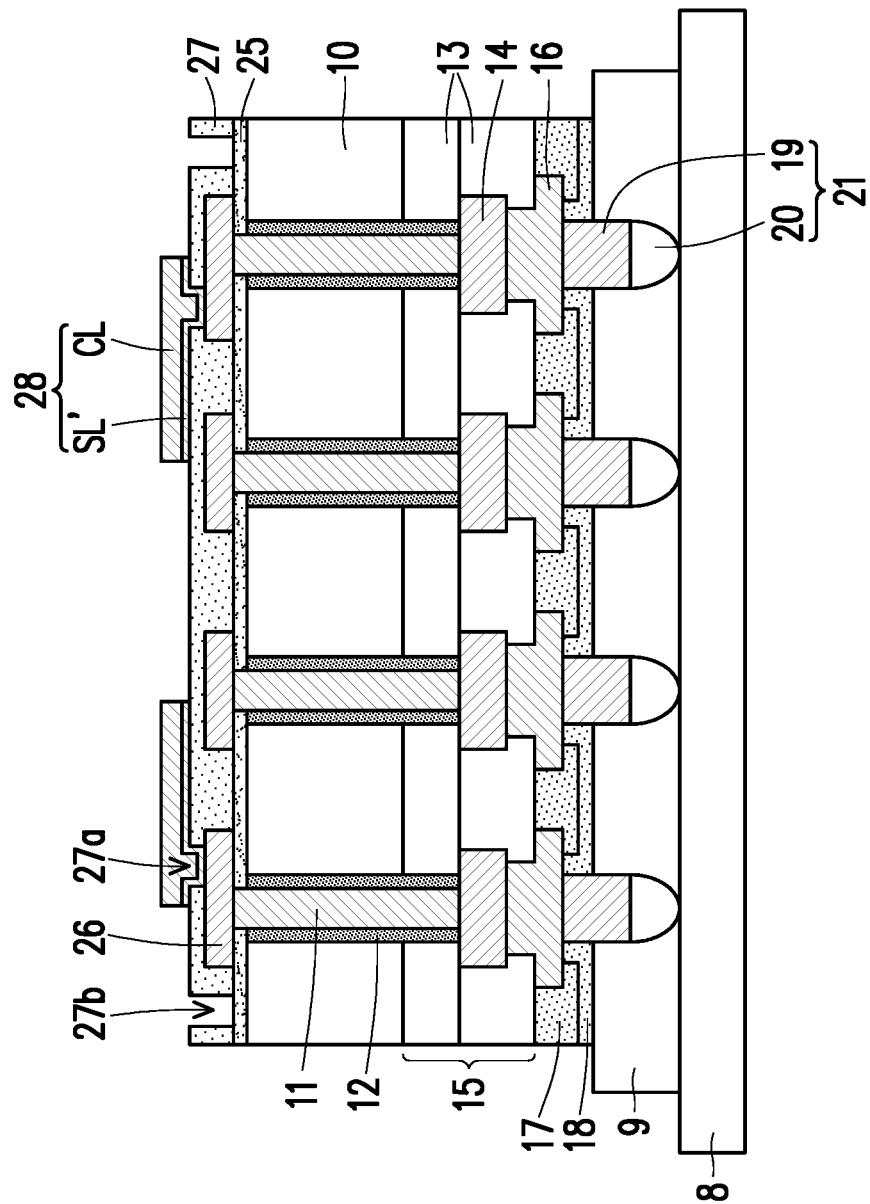
Figure 3C:
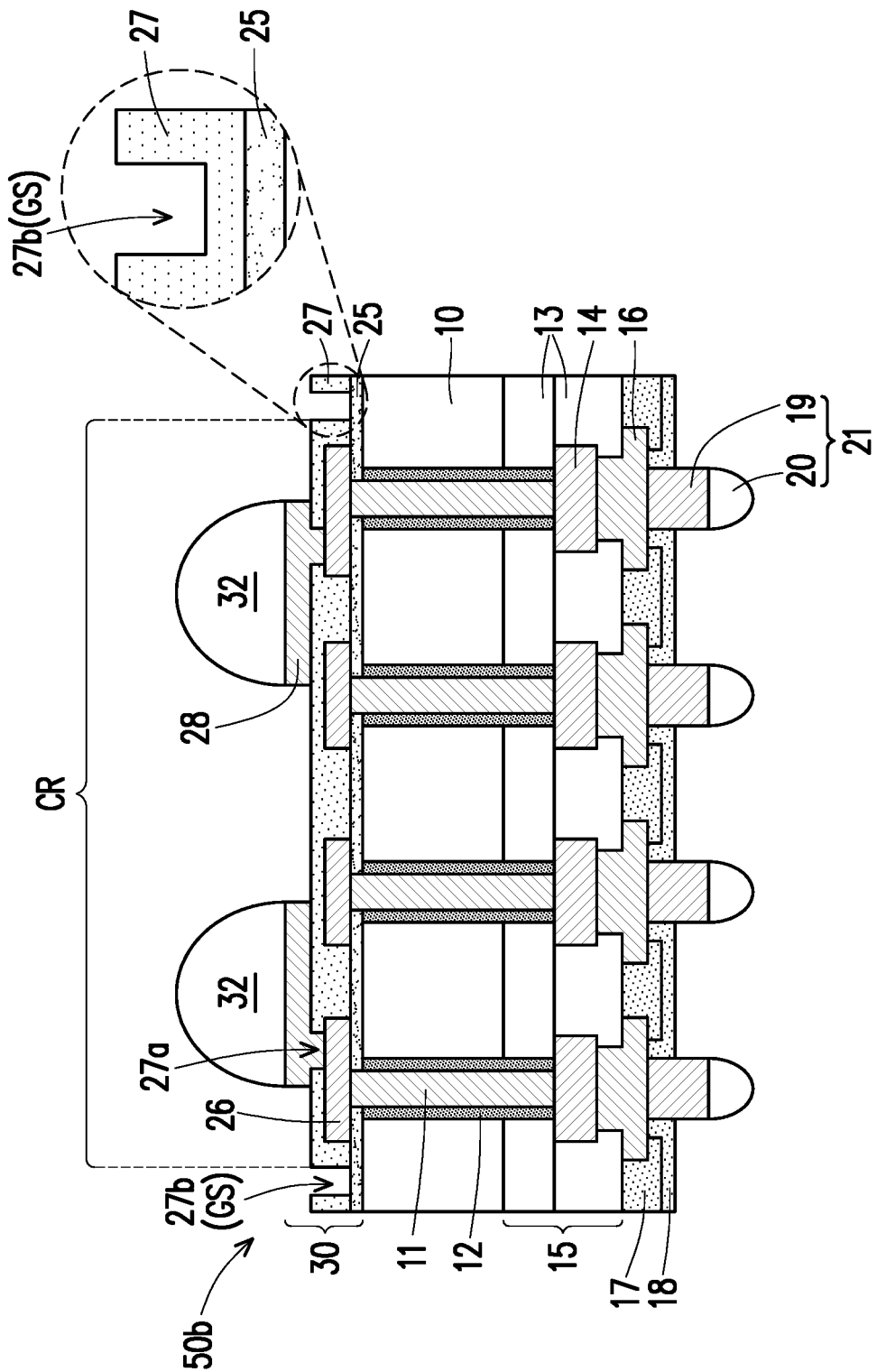

FIG. 3A to FIG. 3C are cross-sectional views illustrating a method of forming an IPD according to alternative embodiments of the disclosure.

Referring to FIG. 3A, in some embodiments, after the dielectric layer 27 is patterned to form the openings 27a and 27b, a seed layer SL is formed on the dielectric layer 27 and lining the surfaces of the openings 27a and 27b. A patterned mask layer 35 is formed on the seed layer SL for defining the subsequently formed redistribution layer 28. The patterned mask layer 35 has openings 35a exposing a portion of the seed layer SL at the intended locations for the redistribution layer 28. Specifically, portions of the seed layer SL in the openings 27a and on the top surface of the dielectric layer 27 are exposed by the openings 35a of the patterned mask layer 35. In the present embodiments, the patterned mask layer 35 fills into the openings 27b, such that the portions of the seed layer SL within the openings 27b are covered by the patterned mask layer 35. Thereafter, a conductive layer CL is formed on the portion of the seed layer SL exposed by the openings 35a of the patterned mask layer 35 by electroplating process, for example.

Referring to FIG. 3A and FIG. 3B, the patterned mask layer 35 is then removed by a stripping or an ashing process, and portions of the seed layer SL previously covered by the patterned mask layer 35 are removed by an etching process using the conductive layer CL as an etching mask. As such, the conductive layer CL and the remained seed layer SL' underlying thereof constitute the redistribution layer 28. During the etching process, the portions of the seed layer SL within the opening 27b are removed, and the openings 27b of the dielectric layer 27 are re-exposed. The dielectric layer 27 and the redistribution layers 26 and 28 constitute a RDL structure 30. It is noted that, the seed layer SL' and the conductive layer CL of the redistribution layer 28 are not specifically shown in the following figures, for the sake of brevity.

Referring to FIG. 3B and FIG. 3C, a plurality of connectors 32 are formed on the redistribution layer 28. The tape 9 is de-bonded from the overlying structure, and the carrier 8 is released. A singulation process is performed to singulate the IPDs, and an IPD 50b is thus formed. The IPD 50b is similar to the IPD 50a, except that the IPD 50b uses the opening 27b as the guard structure GS, instead of a dam structure.

Referring to FIG. 3C, in some embodiments, the IPD 50b includes the RDL structure 30 disposed on back side of the substrate 10. In the present embodiment, the opening 27b is formed in the dielectric layer 27b to serve as the guard structure GS. The opening 27b may include trench(es), hole(s), or the like or combinations thereof. The opening 27b may also be referred to as recess of the dielectric layer 27. In some embodiments, the opening 27b extends through the dielectric layer 27 and may expose a portion of the top surface of the isolation layer 25, that is, the opening 27b may be defined by the sidewalls of the dielectric layer 27 and the top surface of the isolation layer 25, and the depth of the opening 27b may be substantially equal to the thickness of the dielectric layer 27. However, the disclosure is not limited thereto. In some alternative embodiments, as shown in the enlarged view, the opening 27b may extend into the dielectric layer 27 without extending through the dielectric layer 27. In other words, the opening 27b extend from a top surface of the dielectric layer 27 downward to a point in the dielectric layer 27 and over the isolation layer 25. The isolation layer 25 may be covered by the dielectric layer 27 and not exposed by the opening 27b. The depth of the opening 27b may be less than the thickness of the dielectric layer 27. In yet another embodiment, the opening 27b may extend into the isolation layer 25, and the depth of the opening 27b may be larger than the thickness of the dielectric layer 27. The other structural features of the IPD 50b are substantially the same as those of the IPD 50b, which are not described again here.

Figure 4A:
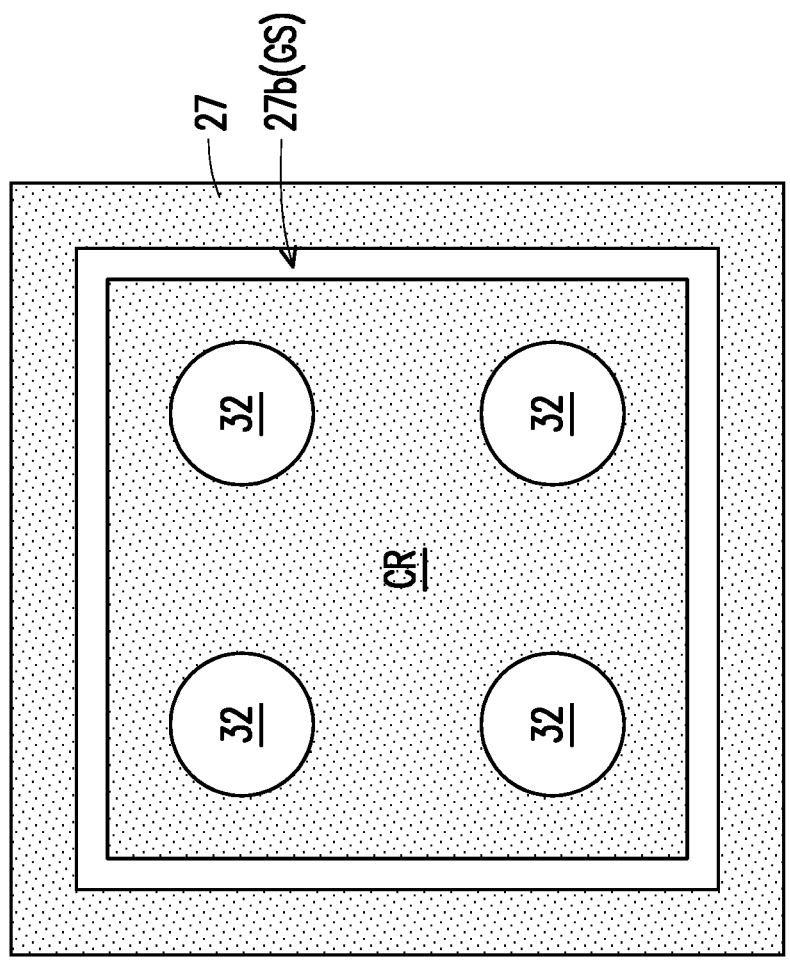
FIG. 4A to FIG. 4D and FIG. 5A to FIG. 5D are top views of IPDs illustrating various configurations of guard structure according to some alternative embodiments of the disclosure.

FIG. 4A is a top view of the IPD 50b, and merely the dielectric layer 27, the guard structure GS and the connectors 32 are shown in the top view for the sake of brevity. In some embodiments, as shown in FIG. 4A, the guard structure GS may include a continuous opening (e.g., trench) 27b disposed in the dielectric layer 27. The opening 27b may be configured as a ring-shaped trench extending laterally surrounding a connector region CR within which the connectors 32 are disposed. In other words, the opening 27b forms a guard ring laterally surrounding the connector region CR. The connector region CR may be defined by inner sidewalls of the trench 27b. In some embodiments, a portion of the dielectric layer 27 within the connector region CR and a portion of the dielectric layer 27 outside the connector region CR are separated apart from each other by the trench 27b. However, the disclosure is not limited thereto.

Figure 4B:
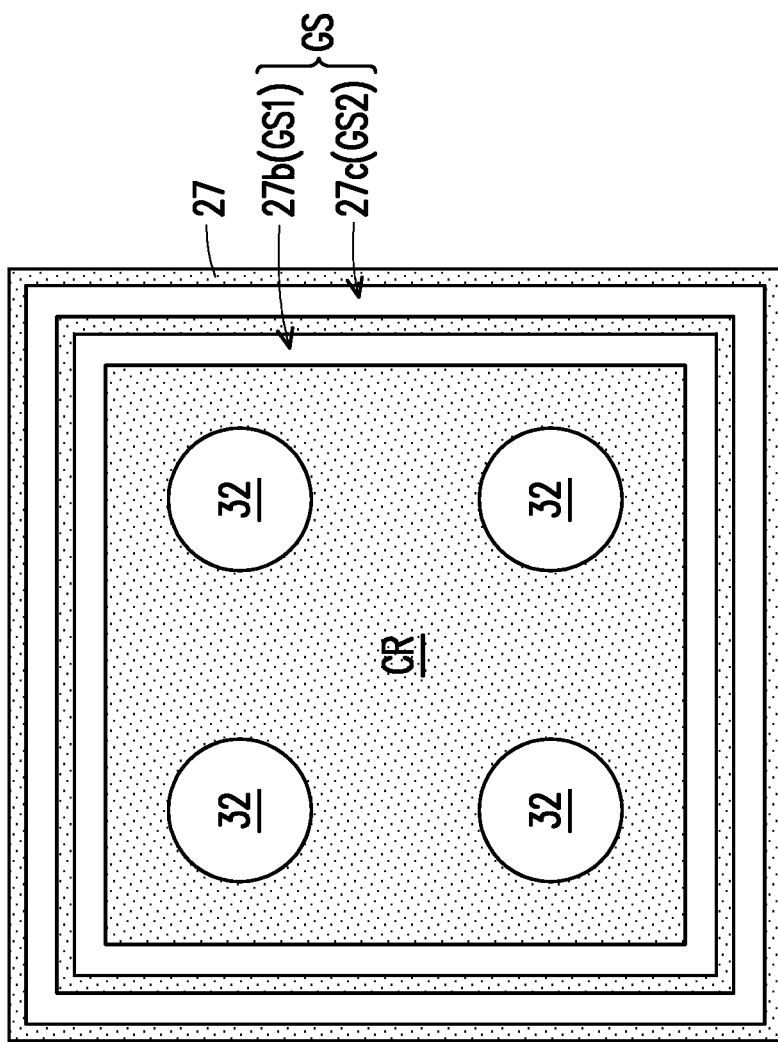
Figure 4C:
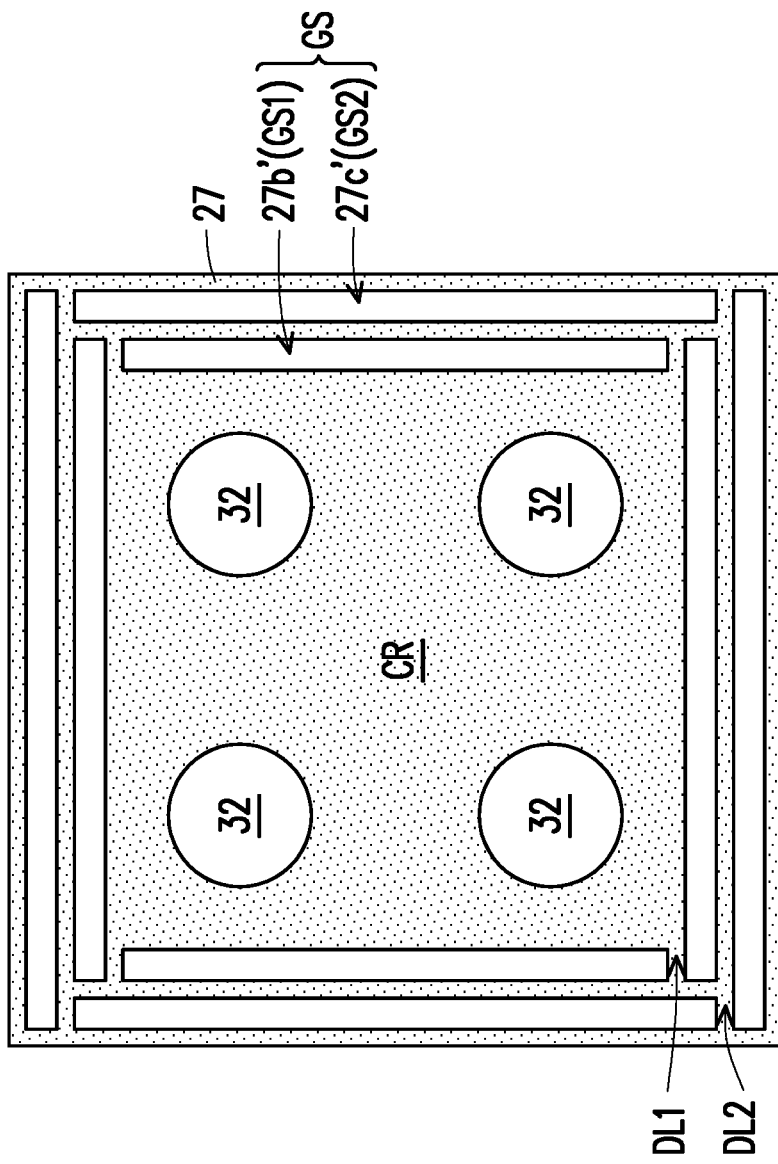
Figure 4D:
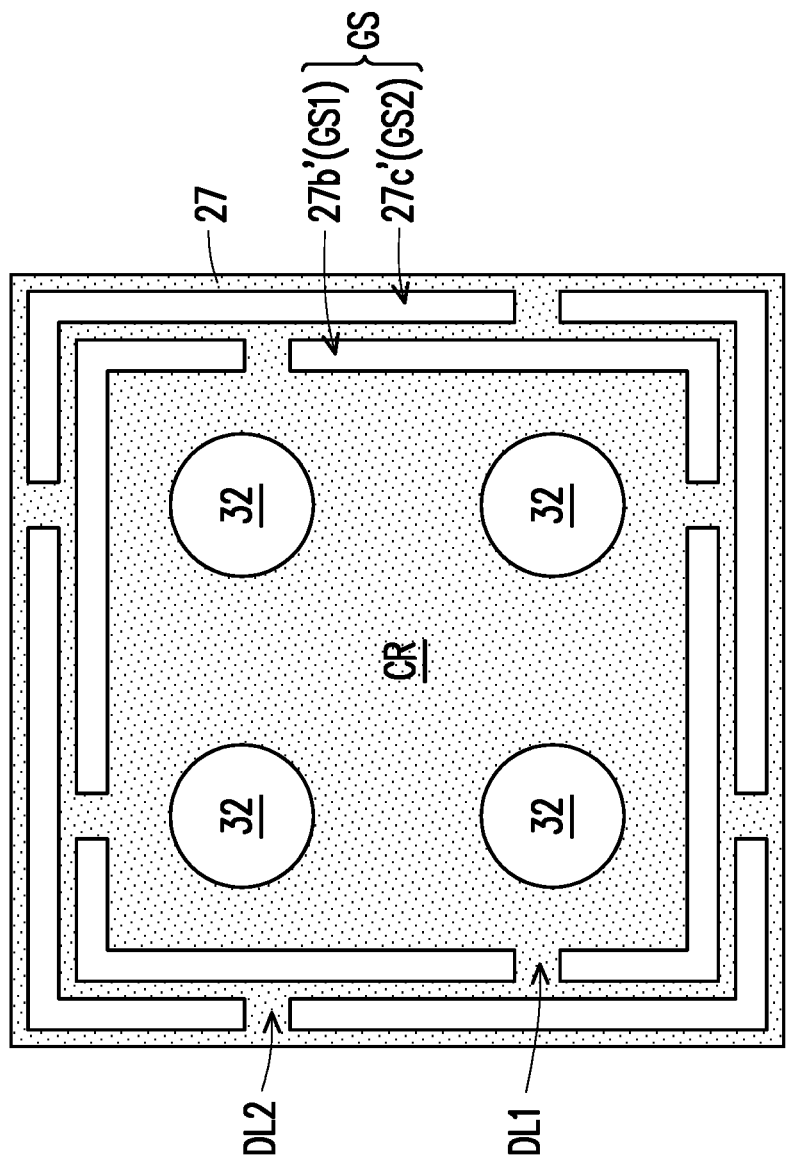

FIG. 4B to FIG. 4D are cross-sectional views illustrating configurations of the guard structure GS including openings according to some other embodiments of the disclosure.

Referring to FIG. 4B, in alternative embodiments, the guard structure GS may include more than one continuous opening (e.g., trench) disposed in the dielectric layer 27. For example, two continuous openings (e.g., trench) 27b and 27c may be configured as ring-shaped and serve as guard rings GS1 and GS2 laterally surrounding the connector region CR within which the connectors 32 are disposed. In some embodiments, the connector region CR is defined by inner sidewall of trench 27b. The trench 27c laterally surrounds the trench 27b, and the trenches 27b and 27c are laterally spaced from each other by the dielectric layer 27 therebetween. In some embodiments, the plurality of ring-shaped trenches 27b and 27c may be concentric or not.

In yet alternative embodiments, as shown in FIG. 4C and FIG. 4D, the guard structure GS may include a plurality of opening (e.g., trenches, holes, or the like, such as the trenches 27b' and 27c') constituting one or more guard ring(s) (e.g., guard rings GS1 and GS2) laterally surrounding the connector region CR, and each guard ring GS1/GS2 may include a plurality of non-continuous openings 27b'/27c'. In some embodiments, the discontinuity locations DL1 of a first guard ring GS1 and may be staggered with the discontinuity locations DL2 of a second guard ring GS2.

FIG. 5A to FIG. 5D are top views of IPDs illustrating configurations of the guard structures GS according to some other embodiments of the disclosure.

Figure 5A:
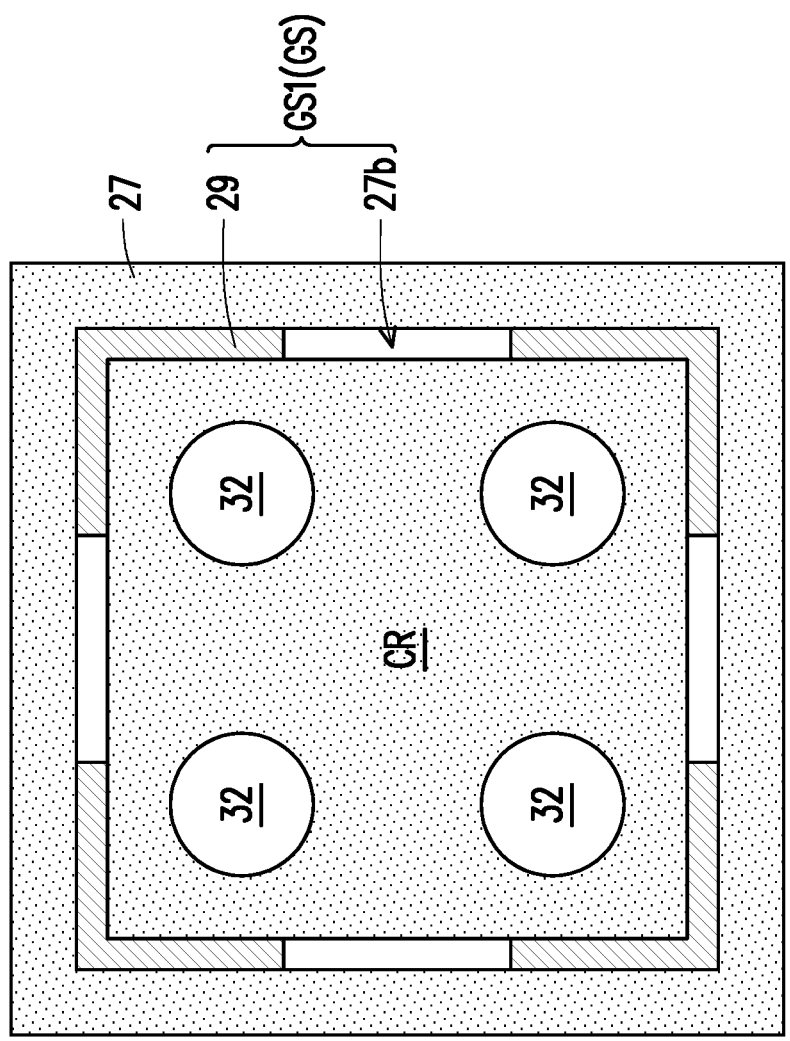

Referring to FIG. 5A, in some embodiments, the guard structure GS includes a guard ring which is constituted by a combination of one or more dam structure 29 and one or more opening (e.g., trench) 27b. For example, a plurality of dam structures 29 and a plurality of openings 27b are configured as a ring and constitute the guard ring GS1. The dam structure 29 and the openings 27b may be connected to each other. In other words, the openings 27b may expose sidewalls of the dam structure 29. However, the disclosure is not limited thereto. In some other embodiments, the dam structures 29 and the openings 27b may be not connected to each other.

Figure 5B:
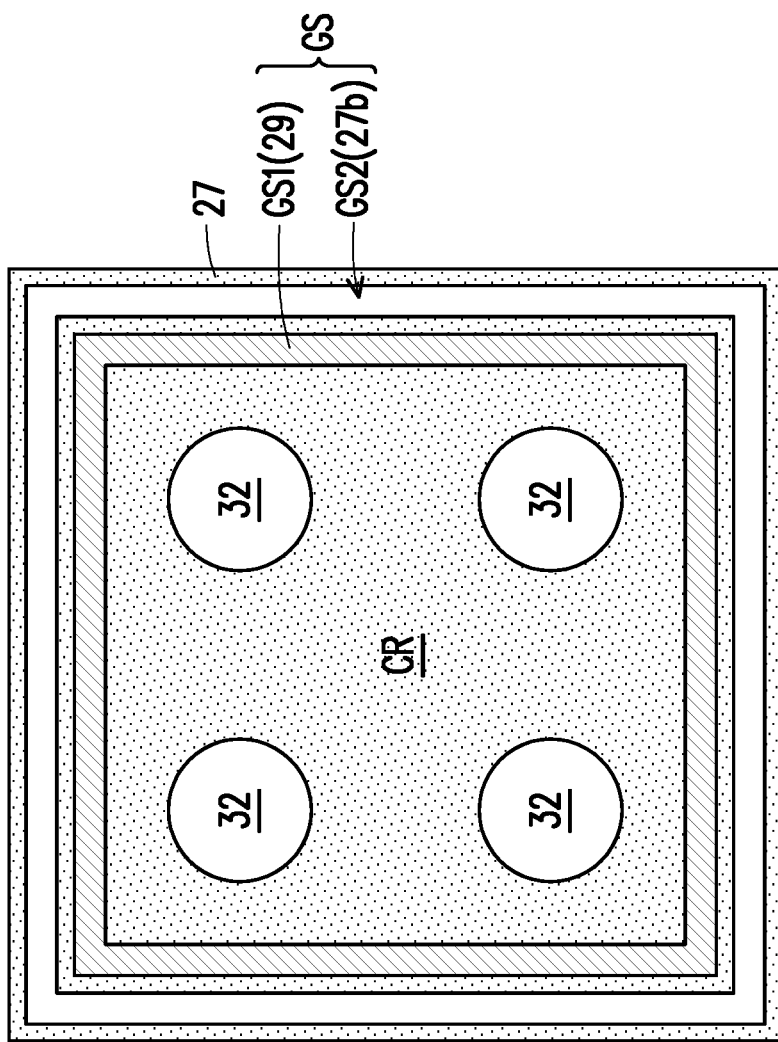

Referring to FIG. 5B, in some embodiments, the guard structure GS includes a plurality of guard rings laterally spaced from each other. One or some of the guard rings may include opening(s), while the other one or some of the guard rings may include dam structure. For example, the guard structure GS includes a first guard ring GS1 and a second guard ring GS2 laterally spaced from each other. One of the first guard ring GS1 and the second guard ring GS2 (e.g., the first guard ring GS1) may include a dam structure 29, while the other one of the first guard ring GS1 and the second guard ring GS2 (e.g., the second guard ring GS2) may include an opening 27b. The dam structure 29 may be configured as a continuous (or non-continuous) ring-shaped structure. The opening 27b may include a continuous (or non-continuous) ring-shaped trench(es).

Figure 5C:
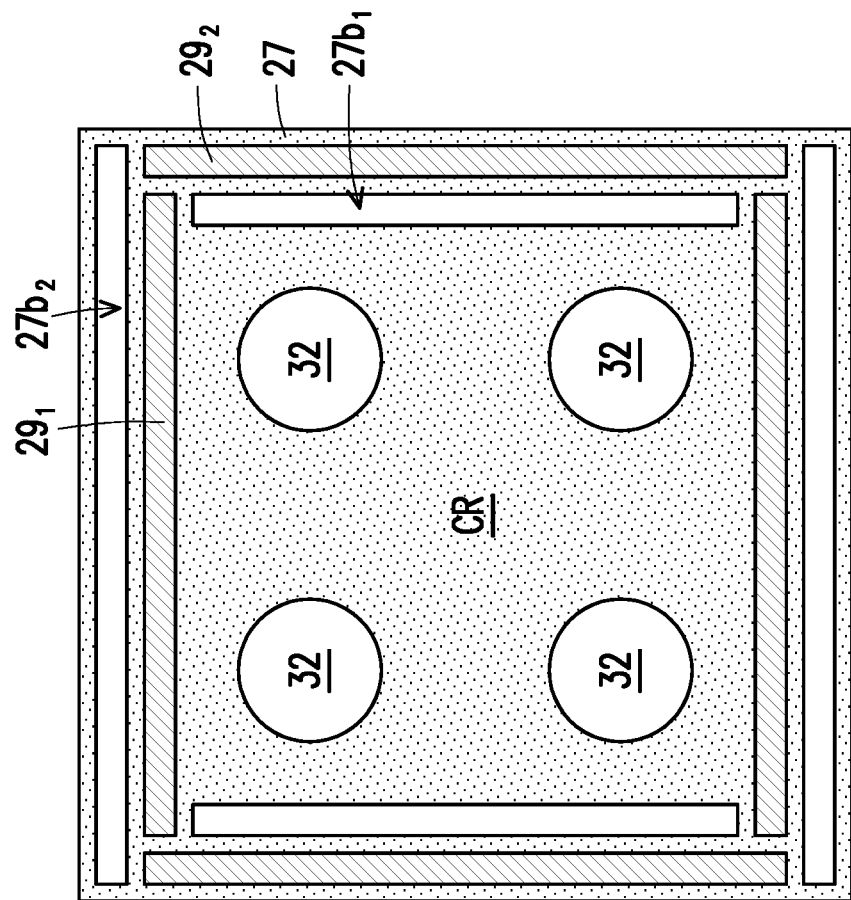
Figure 5D:
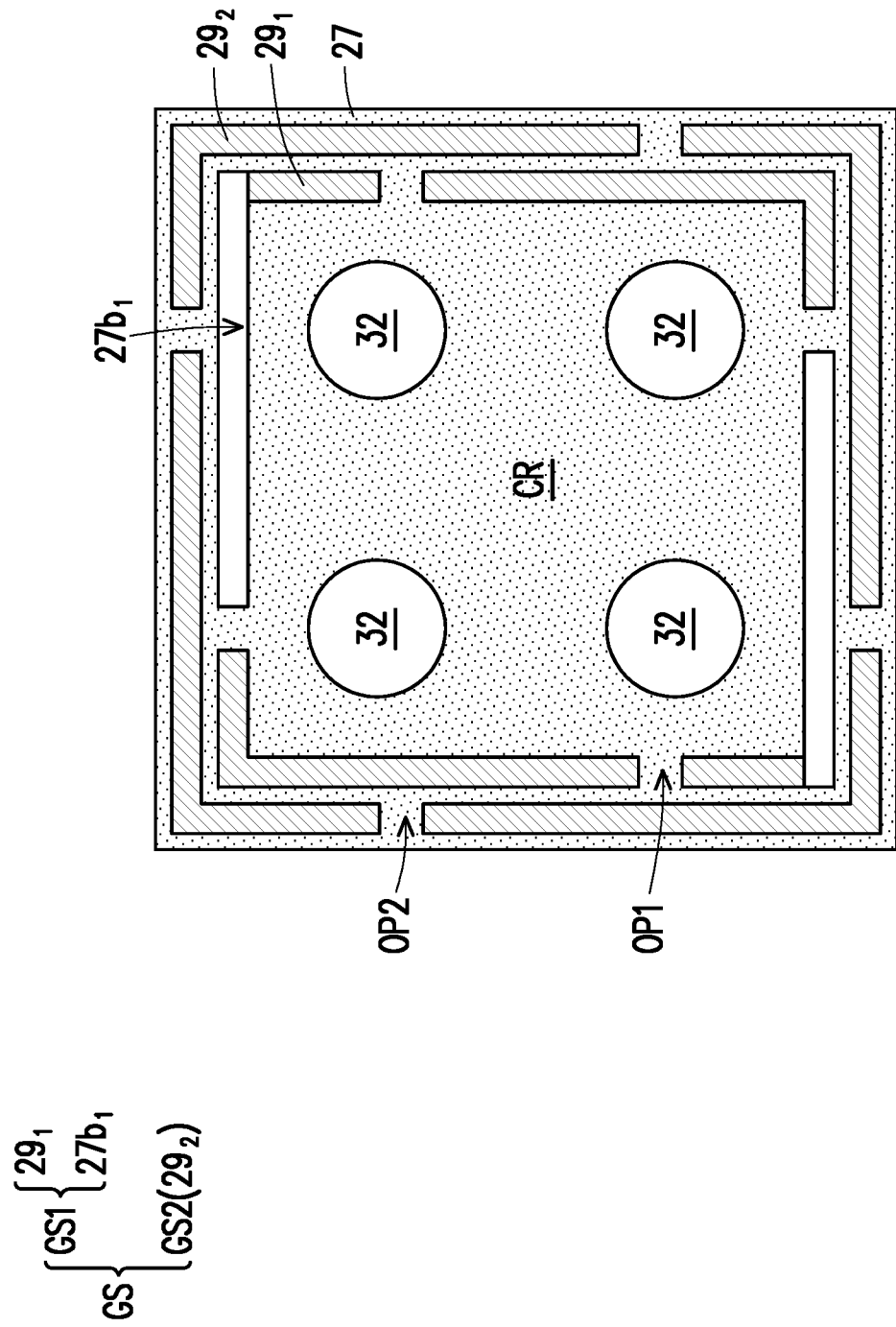

Referring to FIG. 5C, in some embodiments, the guard structure GS includes a plurality of guard rings, such as a first guard ring GS1 and a second guard ring GS2. One or more of the plurality of guard rings may include a combination of dam structure and opening(s) disposed in the dielectric layer 27. For example, the first guard ring GS1 may include dam structures $29_1$ and trenches $27b_1$, while the second guard ring GS2 may also include dam structures $29_2$ and trenches $27b_2$. The dam structure $29_1/29_2$ and trenches $27b_1/27b_2$ included in each guard ring GS1/GS2 may be spaced from each other. In alternative embodiments, some of the dam structures and trenches included in one guard ring (e.g., the dam structure $29_1$ and adjacent trenches $27b_1$ included in the guard ring GS1) may be connected to each other, as shown in FIG. 5D.

It is noted that, the configurations of the dam structures 29 and trenches 27b shown in FIGS. 5A-5D are merely for illustration, and the disclosure is not limited thereto. The guard structure GS1 may include any suitable number of guard rings, and each of the guard rings may include one or more dam structure, one or more trench, or a combination of dam structure and trench, and configurations of dam structure and/or trench in different guard rings may be the same or different.

FIG. 6A to FIG. 6G are cross-sectional views illustrating a method of forming a package structure, and the IPD 50a described above is integrated in the package structure.

Figure 6A:
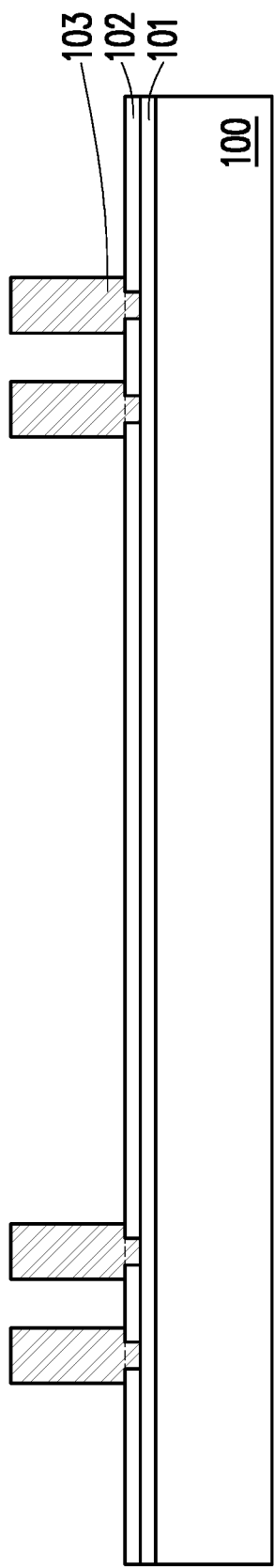
FIG. 6A to FIG. 6G are schematic cross-sectional views illustrating a method of forming a package structure according to some embodiments of the disclosure.

Referring to FIG. 6A, a carrier 100 is provided. The carrier 100 may be a glass carrier, a ceramic carrier, or the like. In some embodiments, the carrier 100 has a de-bonding layer 101 formed thereon. The de-bonding layer 101 is formed by, for example, a spin coating method. In some embodiments, the de-bonding layer 101 may be formed of an adhesive, such as an Ultra-Violet (UV) glue, a Light-to-Heat Conversion (LTHC) glue, or the like, or other types of adhesives. The de-bonding layer 101 is decomposable under the heat of light to thereby release the carrier 100 from the overlying structures that will be formed in subsequent processes.

A dielectric layer 102 is formed on the de-bonding layer 101 over the carrier 100. In some embodiments, the dielectric layer 102 may be a polymer layer including polymer materials, but the disclosure is not limited thereto. Alternatively, the dielectric layer 102 may include inorganic dielectric materials. For example, the dielectric layer 102 may include polybenzoxazole (PBO), polyimide (PI), benzocyclobutene (BCB), ajinomoto buildup film (ABF), solder resist film (SR), or the like, a nitride such as silicon nitride, an oxide such as silicon oxide, an oxynitride such as silicon oxynitride, phosphosilicate glass (PSG), boro silicate glass (BSG), boron-doped phosphosilicate glass (BPSG), or the like, or combinations thereof. The dielectric layer 102 is formed by a suitable fabrication technique such as spin-coating, lamination, deposition such as chemical vapor deposition (CVD), or the like.

Still referring to FIG. 6A, a plurality of conductive vias 103 are formed on the dielectric layer 102. The conductive via 103 includes copper, titanium, nickel, solder, alloys thereof, or the like or combinations thereof. In some embodiments, each of the conductive vias 103 includes a seed layer and a conductive post formed thereon (not individually shown). The seed layer may be a metal seed layer such as a copper seed layer. In some embodiments, the seed layer includes a first metal layer such as a titanium layer and a second metal layer such as a copper layer over the first metal layer. The conductive post may include copper or other suitable metals. However, the disclosure is not limited thereto.

The conductive vias 103 may include a via portion embedded in the dielectric layer 102 and a post portion disposed on the via portion and on the dielectric layer 102. The post portion may have a larger width than the via portion, but the disclosure is not limited thereto. In alternative embodiments, the whole conductive via 103 may be located on the top surface of the dielectric layer 102 and free of the via portion. In yet another embodiment, a RDL structure (not shown) including a plurality of dielectric layers and redistribution layers may be formed on the carrier, and the conductive via 103 is formed on the topmost dielectric layer of the RDL structure and may include a via portion landing on and electrically connected to the redistribution layer of the RDL structure.

In some embodiments, the conductive vias 103 may be formed by the following processes: a patterning process may be performed on the dielectric layer 102 to form via holes in the dielectric layer 102; a seed material layer is then formed on the dielectric layer 102 and lining the via hole by a sputtering process, a patterned mask layer such as a patterned photoresist is formed on the seed material layer. The patterned mask layer includes openings exposing portions of seed material layer at the intended locations for the conductive vias 103. The conductive posts are then formed on the seed material layer exposed by the patterned mask layer. Thereafter, the patterned mask layer is stripped, and the portions of the seed material layer not covered by the conductive posts are removed. As such, the conductive posts and the underlying seed layers constitute the conductive vias 103. In some other embodiments, the conductive vias 103 further include a barrier layer (not shown) under the seed layer to prevent metal diffusion. The material of the barrier layer includes, for instance, metal nitride such as titanium nitride, tantalum nitride, or a combination thereof.

Figure 6B:
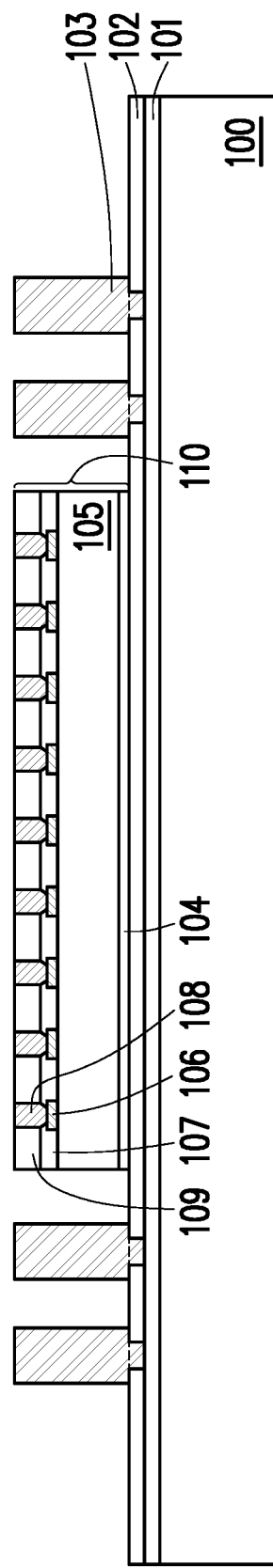

Referring to FIG. 6B, a die 110 is mounted over the carrier 100 by pick and place processes, for example. In some embodiments, the die 110 is attached to the dielectric layer 102 through an adhesive layer 104, such as die attach film (DAF), silver paste, or the like. The die 110 is mounted within the package regions over the carrier 100, for example. Although one package region is illustrated in the figures, the carrier 100 may include a plurality of similar package regions within which package structures are to be formed. In some embodiments, more than one die 110 may be mounted as side by side in each package region, and the number of die(s) 110 mounted in respective package region is not limited in the disclosure.

Still referring to FIG. 6B, the die 110 may be singulated from a semiconductor wafer, for example. In some embodiments, the die 110 is a device die including various active devices, passive devices, or combinations thereof. For example, the die 110 may respectively be an application-specific integrated circuit (ASIC) chip, an System on Chip (SoC), an analog chip, a sensor chip, a wireless and radio frequency chip, a voltage regulator chip, a logic die such as a Central Processing Unit (CPU) die, a Micro Control Unit (MCU) die, a BaseBand (BB) die, an Application processor (AP) die, or a memory chip such as a Dynamic Random Access Memory (DRAM) die, a Static Random Access Memory (SRAM) die, or a high bandwidth memory (HBM) chip, or the like, other suitable types of die, for example.

In some embodiments, the die 110 includes a substrate 105, a plurality of pads 106, a plurality of connectors 108, and passivation layers 107 and 109. In some embodiments, the substrate 105 is made of silicon or other semiconductor materials. Alternatively or additionally, the substrate 105 includes other elementary semiconductor materials such as germanium, gallium arsenic, or other suitable semiconductor materials. In some embodiments, the substrate 105 may further include other features such as various doped regions, a buried layer, and/or an epitaxy layer. Moreover, in some embodiments, the substrate 105 is made of an alloy semiconductor such as silicon germanium, silicon germanium carbide, gallium arsenic phosphide, or gallium indium phosphide. Furthermore, the substrate 105 may be a semiconductor on insulator such as silicon on insulator (all) or silicon on sapphire.

In some embodiments, a plurality of devices (not shown) are formed in and/or on the substrate 105. The devices may be active devices, passive devices, or combinations thereof. For example, the devices may include transistors, capacitors, resistors, diodes, photodiodes, fuse devices, or the like, or combinations thereof. In some embodiments, an interconnection structure (not shown) including a dielectric structure and interconnect wirings are formed over the devices on the substrate 105. The interconnect wirings are embedded in the dielectric structure and electrically connected to the devices to form a functional circuit. In some embodiments, the dielectric structure includes inter-layer dielectric layers (ILDs) and inter-metal dielectric layers (IMDs). The interconnect wirings may include multi-layers of conductive lines, conductive vias, and conductive contacts. The conductive contacts may be formed in the ILDs to electrically connect the conductive lines to the devices; the conductive vias may be formed in the IMDs to electrically connect the conductive lines in different tiers. The interconnect wirings may include metal, metal alloy or a combination thereof, such as tungsten (W), copper (Cu), copper alloys, aluminum (Al), aluminum alloys, or combinations thereof.

The pads 106 may be or electrically connected to a top conductive feature of the interconnection structure, and further electrically connected to the devices formed on the substrate 105 through the interconnection structure. The material of the pads 106 may include metal or metal alloy, such as aluminum, copper, nickel, or alloys thereof.

The passivation layer 107 is formed over the substrate 105 and covers portions of the pads 106. The other portions of the pads 106 are exposed by the passivation layer 107 for external connection. The connectors 108 are formed on and electrically connected to the pads 106 not covered by the passivation layer 107. The passivation layer 109 may be formed on the passivation layer 107 and laterally covering sidewalls of the connectors 108. The passivation layers 107 and 109 may each include an insulating material such as silicon oxide, silicon nitride, polymer, or a combination thereof. The polymer may include polybenzoxazole (PBO), polyimide (PI), benzocyclobutene (BCB), the like, or combinations thereof. The connectors 108 may include solder bumps, gold bumps, copper bumps, copper posts, copper pillars, or the like.

Figure 6C:
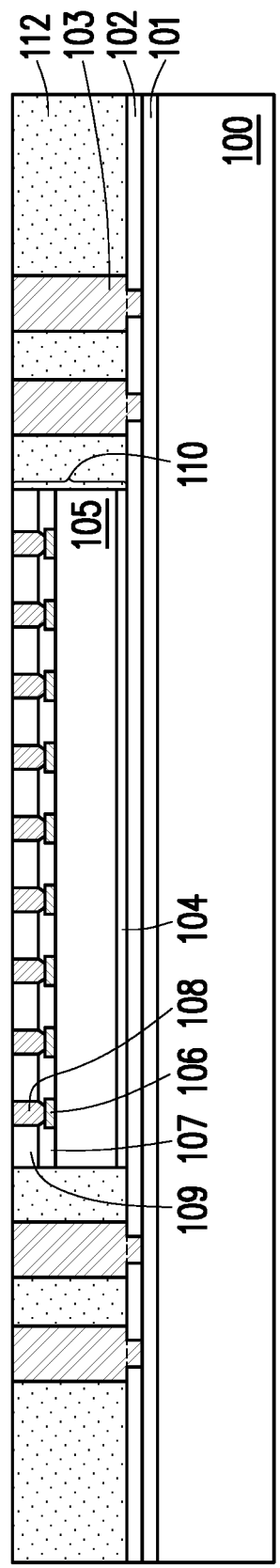

Referring to FIG. 6C, an encapsulant 112 is formed over the carrier 100 to encapsulate the die 110 and the conductive vias 103. In some embodiments, the encapsulant 112 may include a molding compound, a molding underfill, a resin such as epoxy, a combination thereof, or the like. In some other embodiments, the encapsulant 112 includes a photo-sensitive material such as polybenzoxazole (PBO), polyimide (PI), benzocyclobutene (BCB), a combination thereof, or the like. In alternative embodiments, the encapsulant 112 includes nitride such as silicon nitride, oxide such as silicon oxide, phosphosilicate glass (PSG), borosilicate glass (BSG), boron-doped phosphosilicate glass (BPSG), a combination thereof, or the like.

In some embodiments, the encapsulant 112 may include a molding compound which is a composite material. For example, the encapsulant may include a base material (such as polymer) and a plurality of fillers distributed in the base material. The fillers may include a single element, a compound such as nitride, oxide, or a combination thereof. The fillers may include silicon oxide, aluminum oxide, boron nitride, alumina, silica, or the like, or combinations thereof, for example. In some embodiments, the fillers may be spherical fillers, but the disclosure is not limited thereto. The cross-section shape of the filler may be circle, oval, or any other suitable shape. In some embodiments, the encapsulant 112 is formed by forming an encapsulant material layer over the carrier 100 to encapsulate top surfaces and sidewalls of the die 110 and the conductive vias 103, through a suitable fabrication technique such as molding, spin-coating, lamination, deposition, or similar processes. Thereafter, a planarization process (e.g., CMP) is performed to remove excess portion of the encapsulant material layer over the top surfaces of the die 110 and the conductive vias 103, such that the top surfaces of the connectors 108 of the die 110 and the conductive vias 103 are exposed. In some embodiments, the top surface of the encapsulant 112, the top surfaces of the conductive vias 103 and the top surface of the die 110 are substantially coplanar or level with each other. In some embodiments, the conductive vias 103 may also be referred to as through integrated fan-out vias (TIVs).

Figure 6D:
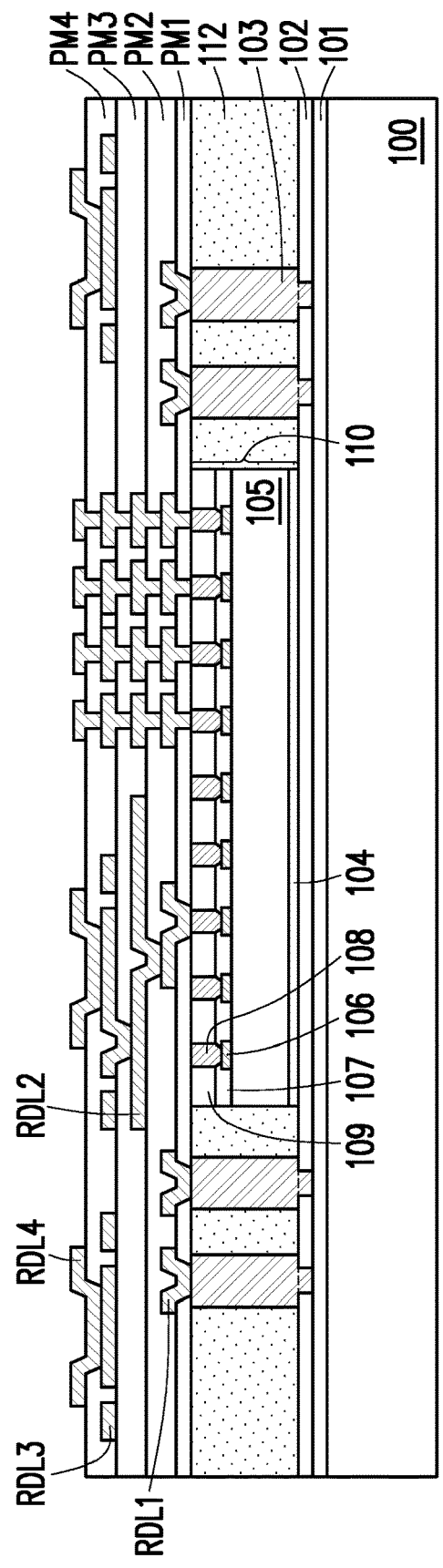

Referring to FIG. 6D, a redistribution layer (RDL) structure 115 is formed over the encapsulant 112 and the die 110. The RDL structure 115 may include a polymer structure (e.g., including multiple polymer layers) and redistribution layers. For example, the RDL structure 115 includes a plurality of polymer layers PM1, PM2, PM3, PM4 and a plurality of redistribution layers RDL1, RDL2, RDL3, RDL4 stacked alternately. The number of the polymer layers or the redistribution layers shown in the figures is merely for illustration, and the disclosure is not limited thereto.

In some embodiments, the redistribution layer RDL1 penetrates through the polymer layer PM1 to be physically and electrically connected to the connectors 108 of the die 110 and the conductive vias 103. The redistribution layer RDL2 penetrates through the polymer layer PM2 to be electrically connected to the redistribution layer RDL1. The redistribution layer RDL3 penetrates through the polymer layer PM3 to be electrically connected to the redistribution layer RDL2. The redistribution layer RDL4 penetrates through the polymer layer PM4 to be electrically connected to the redistribution layer RDL3.

In some embodiments, the polymer layers PM1, PM2, PM3, PM4 respectively includes a polymer material, which may include photo-sensitive material such as polybenzoxazole (PBO), polyimide (PI), benzocyclobutene (BCB), combinations thereof or the like. The forming methods of the polymer layers PM1, PM2, PM3, PM4 include suitable fabrication techniques such as spin coating, chemical vapor deposition (CVD), plasma-enhanced chemical vapor deposition (PECVD), lamination or the like. In some embodiments, the redistribution layers RDL1, RDL2, RDL3, RDL4 respectively include conductive materials. The conductive material includes metal such as copper, nickel, titanium, a combination thereof or the like, and may be formed by PVD, plating such as an electroplating process, or combinations thereof. In some embodiments, the redistribution layers RDL1, RDL2, RDL3, RDL4 respectively includes a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may include copper or other suitable metallic materials.

In some embodiments, the redistribution layer RDL4 may be the topmost redistribution layer of the RDL structure 115, and may be or include an under-ball metallurgy (UBM) layer for ball mounting. Additionally, the redistribution layer RDL4 may include conductive pads.

Figure 6E:
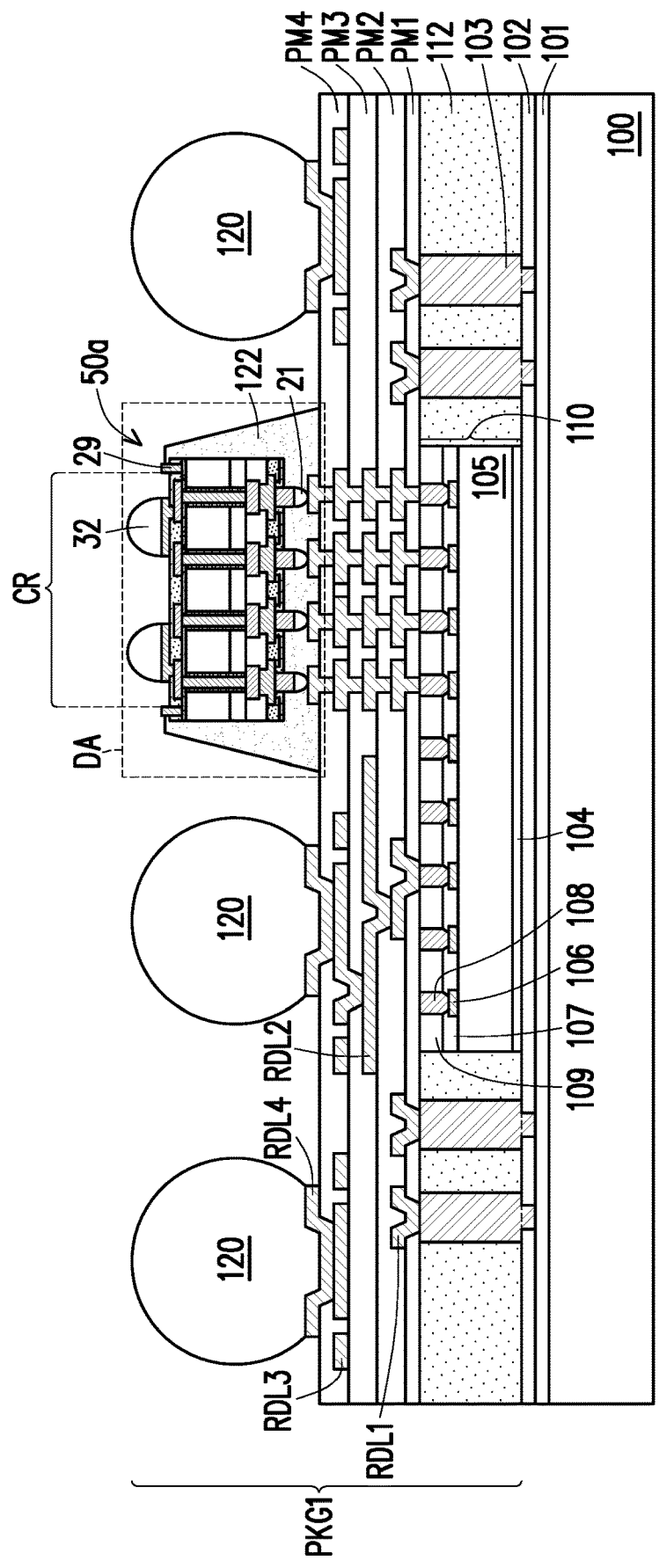

Referring to FIG. 6E, a plurality of connectors 120 are formed over and electrically connected to the redistribution layer RDL4 (e.g., UBM) of the RDL structure 115. In some embodiments, the connectors 120 may also be referred to as conductive terminals. In some embodiments, the connectors 120 may be ball grid array (BGA) connectors, solder balls, controlled collapse chip connection (C4) bumps, or a combination thereof. In some embodiments, the material of the connector 120 includes copper, aluminum, lead-free alloys (e.g., gold, tin, silver, aluminum, or copper alloys) or lead alloys (e.g., lead-tin alloys). The connector 120 may be formed by a suitable process such as evaporation, plating, ball dropping, screen printing and reflow process, a ball mounting process or a C4 process.

Still referring to FIG. 6E, in some embodiments, the IPD 50a formed in FIG. 1G is mounted on the RDL structure 115. In some embodiments, the IPD 50a is electrically bonded to the redistribution layer RDL4 (e.g., conductive pad) through the connectors 21. In other words, the IPD 50a is bonded to the RDL structure 115 with the front surface facing the RDL structure 115, and the back side of the IPD 50a having connectors 32 faces upward. In some embodiments, the connectors 120 and the IPD 50a having connectors 32 may have substantially the same height and may be located at the same level height. In other words, the topmost surfaces or topmost points of the connectors 32 of the IPD 50a may be substantially level with the topmost surfaces or topmost points of the connectors 120.

Figure 8A:
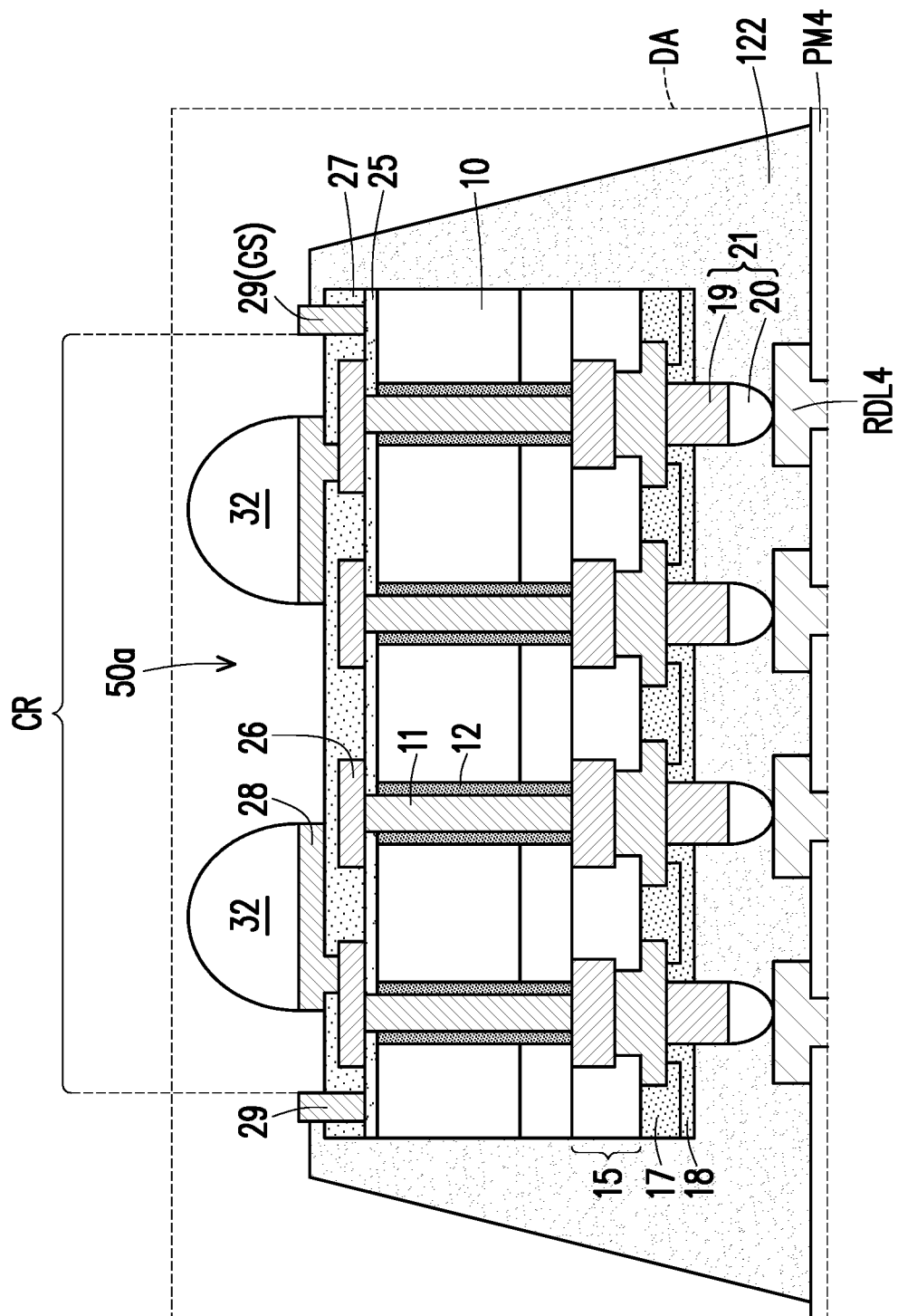
FIG. 8A illustrates an enlarged cross-sectional view of an area DA of FIG. 6E.

Thereafter, an underfill layer 122 may be formed to fill the space between the IPD 50a and the RDL structure 115. The underfill layer 122 may be formed by a dispensing process followed by a curing process. FIG. 8A is an enlarged view of a dashed area DA of FIG. 6E illustrating the underfill layer 122 between the IPD 50a and the RDL structure 115.

Figure 9A:
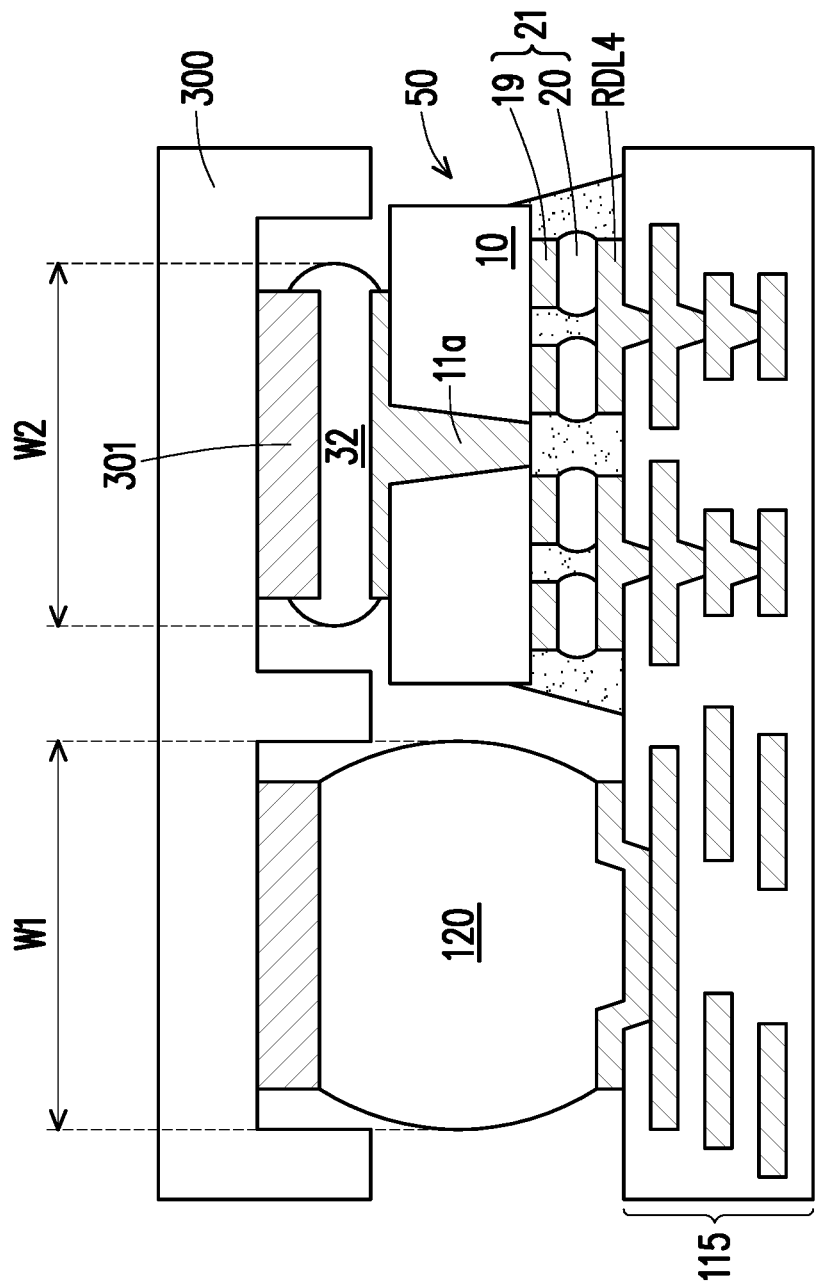
FIG. 9A and FIG.

Referring to FIG. 6E and FIG. 9A, the underfill layer 122 may cover the front surface of the IPD 50a (e.g., including the bottom surface of the passivation layer 18), a portion of the top surface of the topmost polymer layer (e.g., the polymer layer PM4), and the surfaces of the topmost redistribution layer (e.g., redistribution layer RDL4) of the RDL structure 115, and the underfill layer 122 may laterally surround and protect the connectors 21 and the redistribution layer RDL4. In some embodiments, the underfill layer 122 may further cover sidewalls of the IPD 50a. In further embodiments, for example, during the dispensing process, the underfill layer may be applied to or extend toward the back side of the IPD 50a and may cover the top surface of the RDL structure 30 of the IPD 50a. In the embodiments in which the guard structure GS includes dam structure 29, the dam structure 29 is formed to have sufficient height to prevent the underfill layer 122 from being creeping to connector regions CR on back side of the IPD 50a.

Therefore, in the embodiments in which the underfill layer 122 extends to the back side of the IPD 50a, the underfill layer 122 is blocked outside the guard structure GS (e.g., the dam structure 29). For example, the underfill layer 122 may cover a portion of the top surface of the dielectric layer 27 outside the outer sidewall of the dam structure 29, and may further extend to cover and contact the outer sidewall of the dam structure 29. The topmost surface of the underfill layer 122 is not higher than the dam structure 29, such as lower than the top surface of the dam structure 29, or at most substantially level with the top surface of the dam structure 29. In other words, the underfill layer 122 may cover the top surface of a portion of the dielectric layer 27 outside the guard structure GS, and may further extend to cover a lower portion of an outer sidewall of the dam structure 29, while the top portion of the outer sidewall of the dam structure 29 may be exposed or covered by the underfill layer 122. The connector region CR is separated from the underfill layer 122 by the dam structure 29, such that the connector 32 within the connector region CR is protected from being contaminated by the underfill layer 122.

Figure 6F:
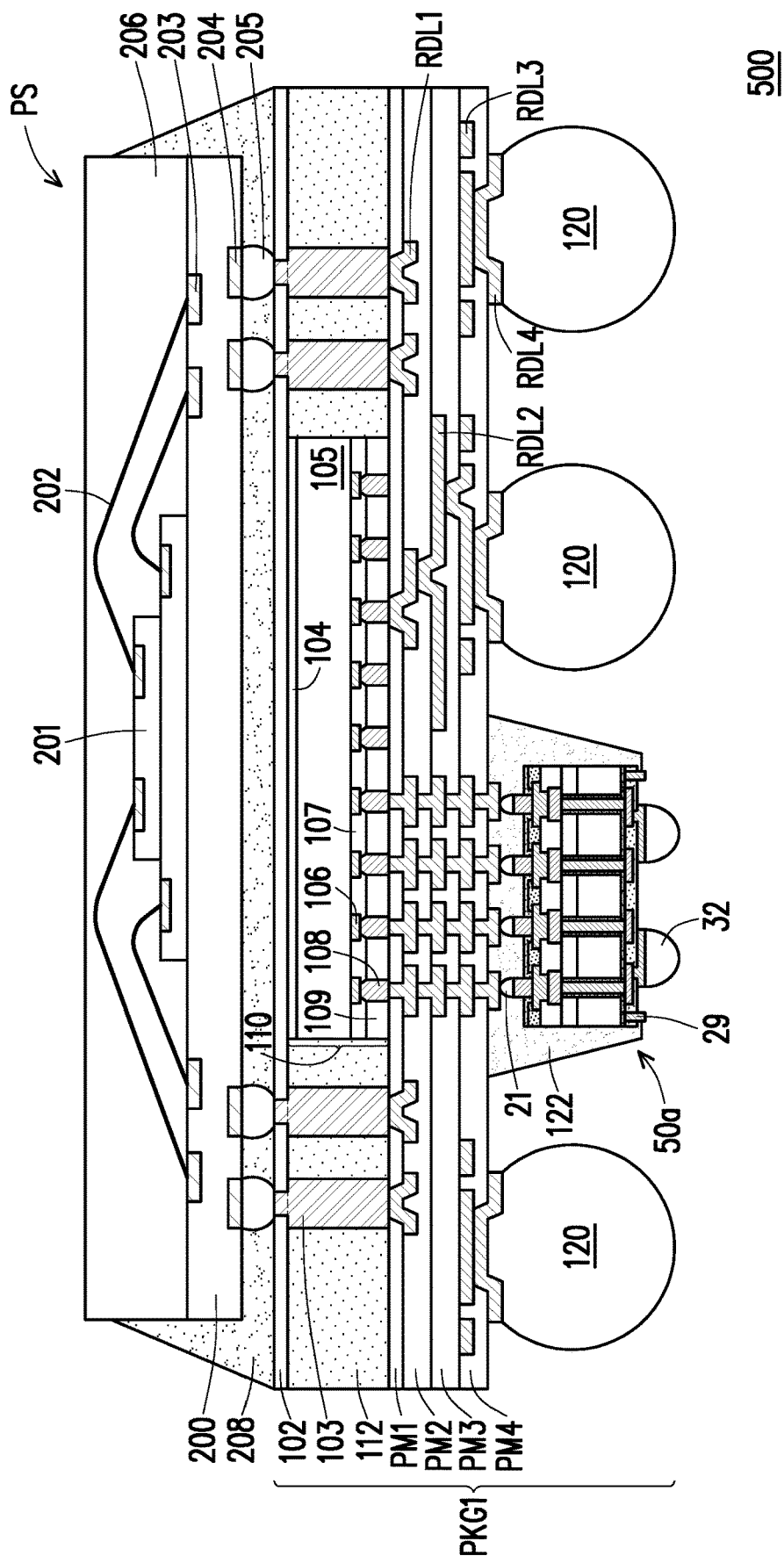

Still referring to FIG. 6E and FIG. 6F, as such, a package structure PKG1 is thus formed over the carrier 100. In some embodiments, the de-bonding layer 101 is decomposed under the heat of light, and the carrier 100 is then released from the overlying structure. The package structure PKG1 may further be coupled to other package components.

Referring to FIG. 6F, for example, a package structure PS may be provided and electrically coupled to the package structure PKG1. In some embodiments, the package structure PS includes a substrate 200, and a die 201 is mounted on one surface (e.g. top surface) of the substrate 200. Bonding wires 202 are used to provide electrical connections between the die 201 and the conductive pads 203 (such as bonding pads) on the same top surface of the substrate 200. Conductive routing and/or conductive vias (not shown) may be used to provide electrical connections between the conductive pads 203 and the conductive pads 204 (such as bonding pads) on an opposing surface (e.g. bottom surface) of the substrate 200. A plurality of connectors 205 are formed to connect to the pads 204. The connectors 205 are metal bumps such as solder bumps. An encapsulant 206 may be formed over the components to protect the components from the environment and external contaminants.

In some embodiments, the connectors 205 are disposed between the conductive pads 204 and the conductive vias 103 (e.g., the via portion of the conductive via 103) to provide the electrical connection between the package structure PKG1 and the package structure PS. In alternative embodiments, the conductive vias 103 may be free of the via portions embedded in the dielectric layer 102. In such embodiments, after the carrier 100 is released, the dielectric layer 102 may be patterned to form a plurality of openings that respectively expose portions of the surfaces of the conductive vias 103. Thereafter, the connectors 205 may fill into the openings of the dielectric layer 102 to be physically and electrically connected to the conductive vias 103 of the package structure PKG1.

In some embodiments, an underfill layer 208 may be disposed to fill the space between the package structures PKG1 and PS. The underfill layer 208 laterally surrounds the connectors 205 and may extend to cover portions of the sidewalls of the package structure PS.

As such, a package-on-package (PoP) device 500 including the package structure PKG1 and the package structure PS is thus formed. The PoP device 500 may be further electrically coupled to other package component.

Figure 6G:
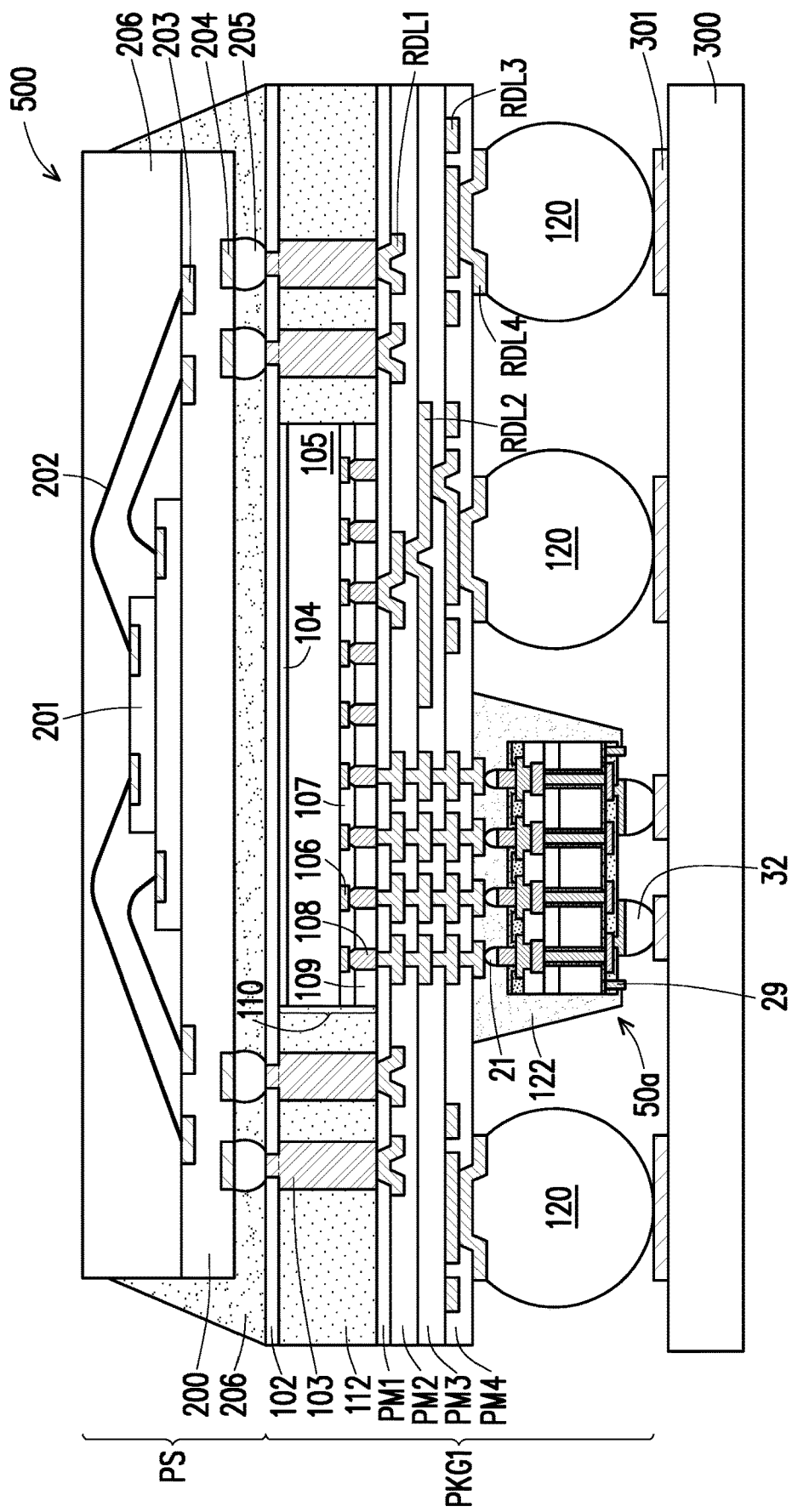

Referring to FIG. 6G, in some embodiments, the PoP device 500 may further be bonded to a package substrate 300. The package structure 300 may be a circuit board, such as a printed circuit board (PCB). The package substrate 300 may include a plurality of conductive pads 301, and the connectors 120 of the package structure PKG1 and the connectors 32 of the IPD 50a may be electrically bonded to the circuit board 300. In some embodiments, the package substrate 300 includes a solder resist (SR) film (not shown) for protecting the surface thereof, and conductive pads 301 are exposed by the SR film for external connection.

It is noted that, throughout the figures, the components are not drawn to scale, and dimensions of the various features may be arbitrarily increased or reduced for clarity of discussion. For example, in FIG. 6G, the connectors 120 on the RDL structure 115 and the connectors 32 of the IPD 50a are shown as have different sizes, and the sizes of the connectors 32 are much smaller than the sizes of the connectors 120. However, the disclosure is not limited thereto. In some embodiments, the connectors 120 and the connectors 32 may have similar sizes (e.g., width). For example, FIG. 9A and FIG. 9B briefly illustrates cross-sectional views of a portion of structure of FIG. 6G according to some other embodiments of the disclosure. For the sake of brevity, some components (e.g., guard structure and interconnector structure of the IPD) shown in FIG. 6G/7B are not specifically shown in FIG. 9A/9B.

Figure 9B:
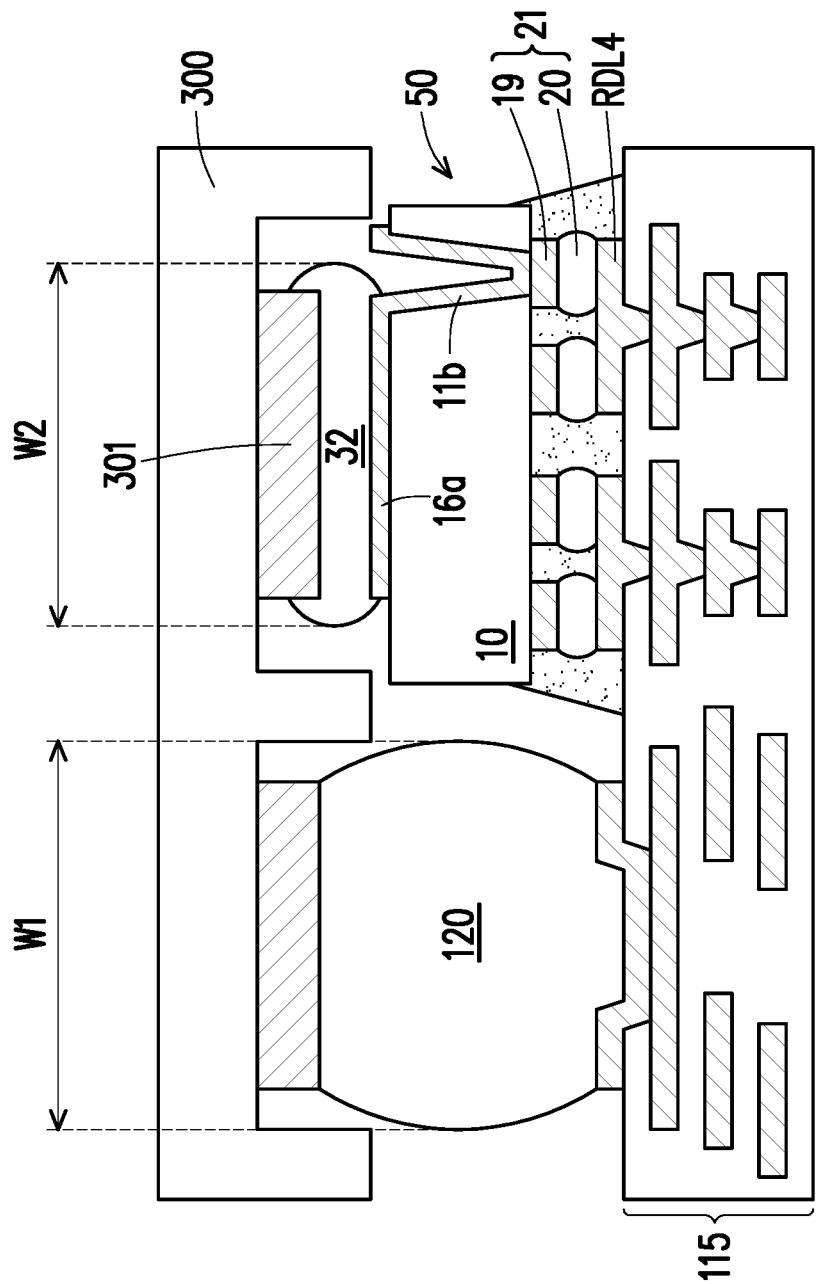
FIG. 9B illustrate partial cross-sectional views of the structure in FIG. 6G according to some other embodiments of the disclosure.

As shown in FIG. 9A and FIG. 9B, in some embodiments, the width W1 of the connector 120 may be substantially equal to the width W2 of the connector 32. For example, the width W1 of the connector 120 and the width W2 of the connector 32 may range from 15 µm to 20 µm, for example. In addition, FIG. 9A and FIG. 9B illustrate the configuration of the connector 32 of the IPD according to some other embodiments of the disclosure, which are described in detail below.

In the above embodiments, for example, as shown in FIG. 1G and FIG. 6G, the connectors 32 land on redistribution layer 28 and are electrically connected to the TSV 11 of the IPD through the RDL structure 30. However, the disclosure is not limited thereto. In some other embodiments, as shown in FIG. 9A, the connectors 32 may be directly disposed on and electrically connected to the TSV structure 11'. The TSV structure 11' may include an embedded portion in the substrate 10 and a pad portion disposed on the back surface of the substrate 10. The connectors 32 may land on the pad portion of the TSV structure 11'. In other words, the IPD may be free of RDL structure disposed on back surface of the substrate, and the connector 32 is in direct contact with and electrically connected to the TSV structure 11'. In yet another embodiments, as shown in FIG. 9B, the TSV 11b may be a conformal layer lining the through hole in the substrate 10, and a redistribution layer 16a is disposed on the substrate 10 and electrically connected to the TSV 11b. The connector 32 is electrically connected to the TSV 11b through the redistribution layer 16a.

Figure 7A:
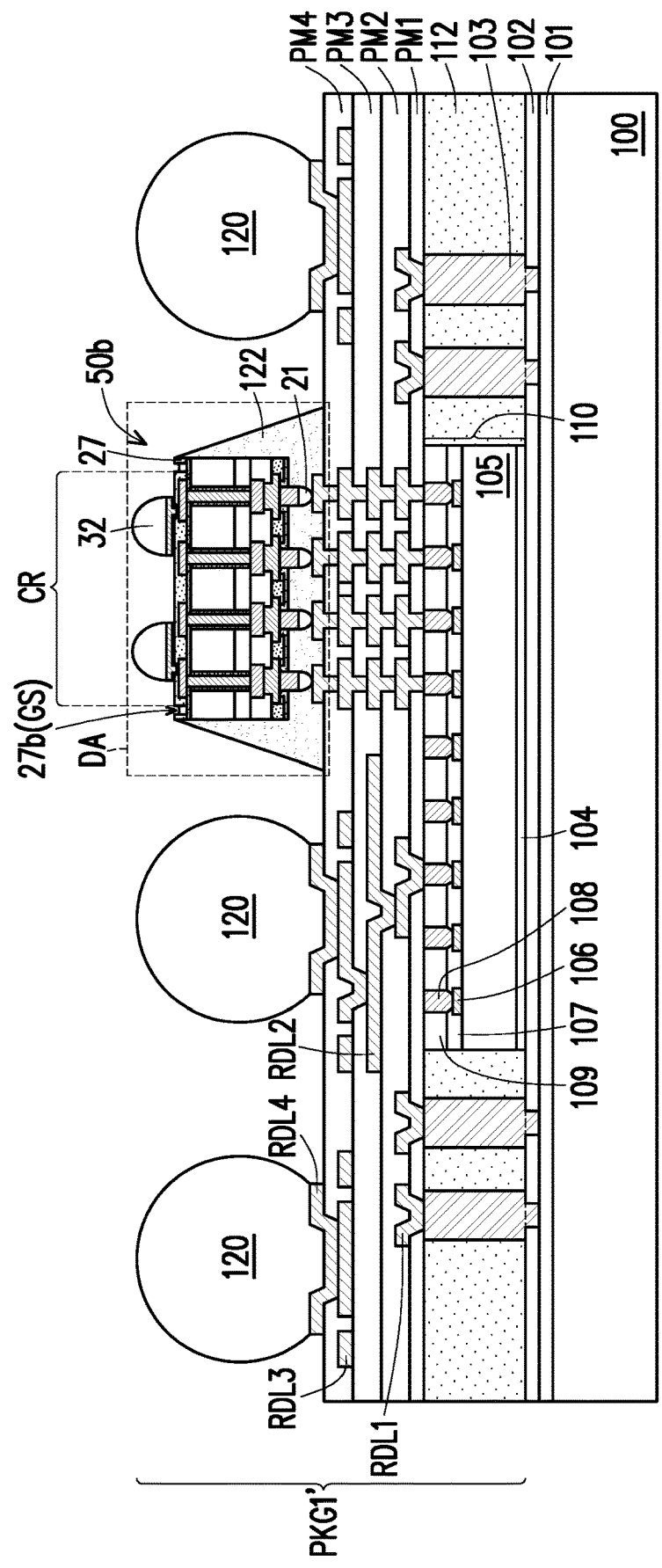
FIG. 7A to FIG. 7B are schematic cross-sectional views illustrating a method of forming a package structure according to some other embodiments of the disclosure.
Figure 7B:
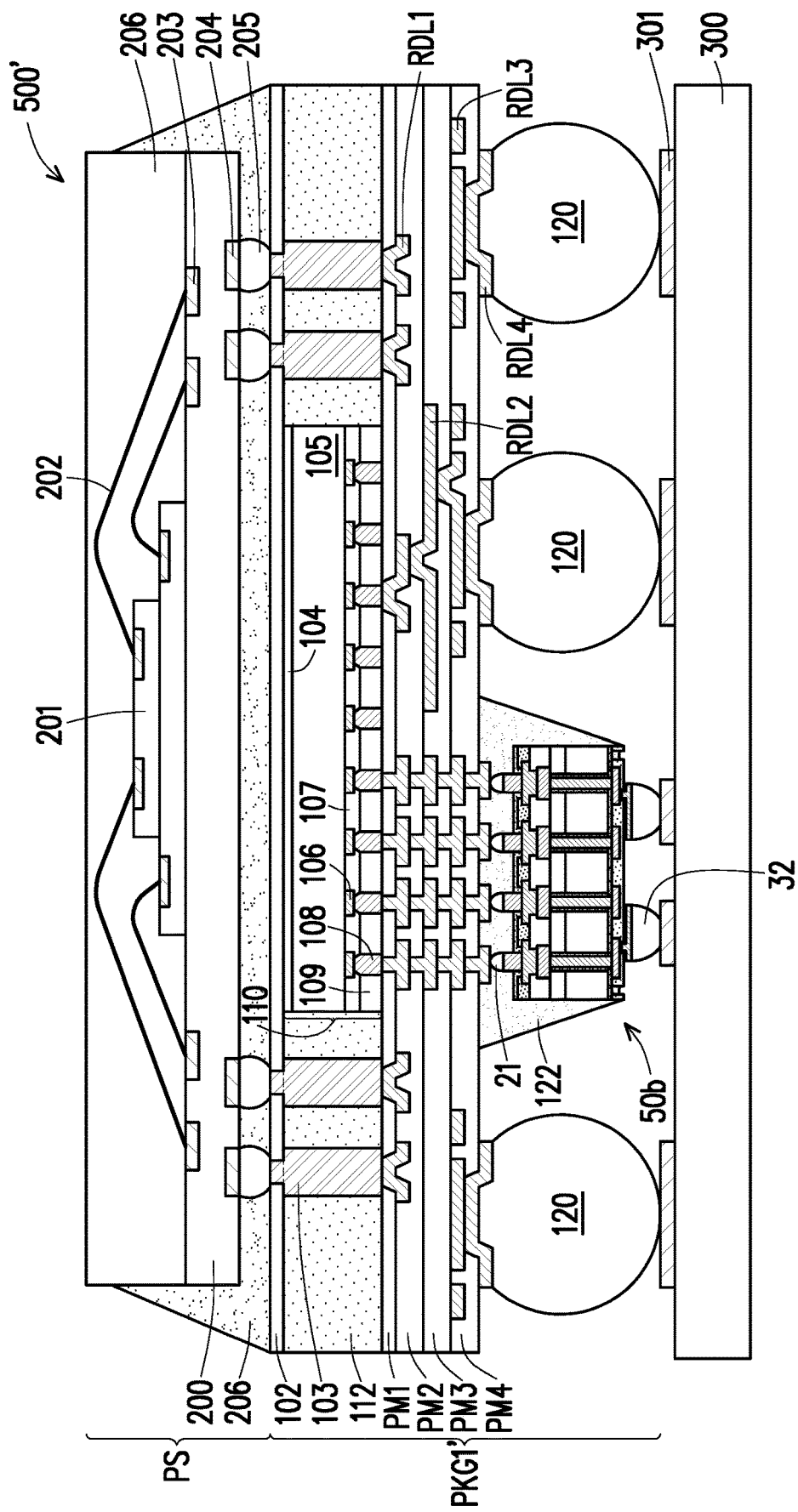

FIG. 7A to FIG. 7B illustrates cross-sectional views of package structures according to some other embodiments of the disclosure.

Figure 8B:
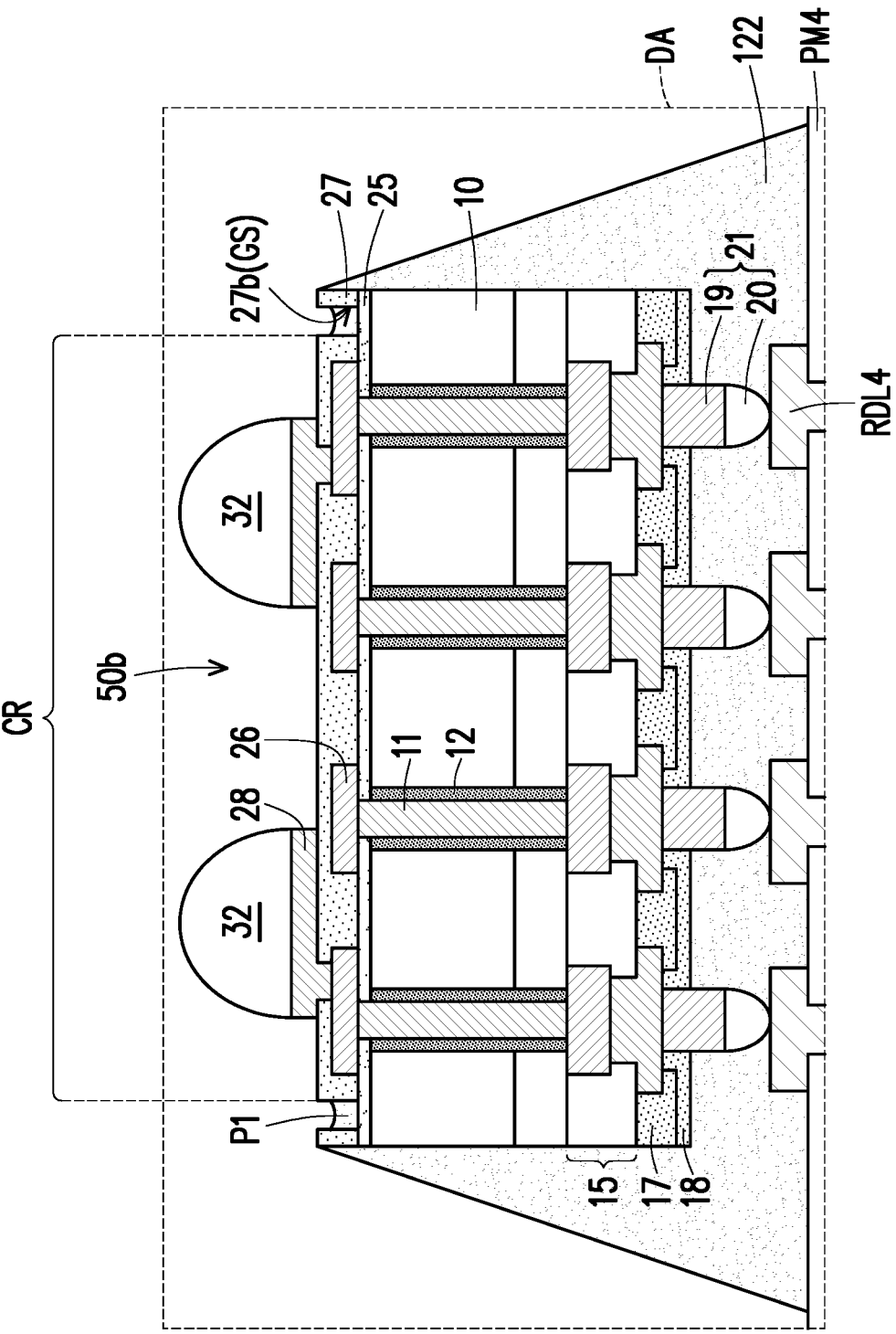
FIG. 8B illustrates an enlarged cross-sectional view of an area DA of FIG. 7A.

Referring to FIG. 7A, in some embodiments, during the manufacturing stage in FIG. 6E, the IPD 50a may be replaced by the IPD 50b that was formed in FIG. 3C, and a package structure PKG1' may be formed over the carrier 100. As shown in FIG. 7A, the IPD 50b may be bonded to the RDL structure 115, and the underfill layer 122 is formed to fill the space between the IPD 50b and the RDL structure 115. FIG. 8B is an enlarged view of a dashed area DA of FIG. 7A, illustrating the underfill layer 122 between the IPD 50b and the RDL structure 115.

In some embodiments, the underfill layer 122 may further extend to cover sidewalls of the IPD 50b. In some embodiments, the underfill layer 122 may be applied to or further extend to the back side of the IPD 50b. In such embodiments, the guard structure GS including guard ring(s) formed by the trench(es) 27b in the dielectric layer 27 are used to prevent the underfill layer 122 from being creeping to connector region CR surrounded by the guard structure GS. In some embodiments in which the underfill layer 122 is applied to or extend to the back side of the IPD 50b, the underfill layer 122 may extend across a portion of the top surface of the dielectric layer 27 outside the guard structure GS, and may fill into the trenches 27b. The portion of the top surface of the dielectric layer 27 outside the guard structure GS may be or may be not covered by and in contact with the underfill layer 122. The top surface of the portion of the dielectric layer 27 within the connector region CR (i.e., inside the guard structure GS) is separated from the underfill layer 122. In such embodiment, the trenches 27b of the guard structure GS are formed to have sufficient size (e.g., volume, depth) and configured for accommodating portions of the underfill layer 122 (if any) that was applied to or extending to the back side of the IPD 50b, so as to prevent the underfill layer 122 from being entering the connector region CR. For example, a portion P1 of the underfill layer 122 may fill into the trench 27b, and the top surface of the portion P1 of the underfill 122 within the trench 27b is not higher than the top surface of the dielectric layer 27, such as lower than the top surface of the dielectric layer 27, or at most substantially level with the top surface of the dielectric layer 27. In alternative embodiments, the underfill layer 27 may not fill into the trench 27b. Through the configuration of the guard structure GS (e.g., trench 27b), the connector region CR surrounded by the guard structure GS is separated from the underfill layer 122 by the guard structure GS, thereby protecting the connectors 32 from being contaminated by the underfill layer 122.

Referring to FIG. 7B, similarly, after the carrier 100 is released, the package structure PKG1' may be electrically connected to the package structure PS to form a PoP device 500', and the PoP device 500' may further be electrically bonded to the package substrate 300.

In some other embodiments in which IPDs having guard structure (e.g., FIGS. 5B-5D) constituted by a combination of dam structure and openings (e.g., trenches), if the underfill layer 122 is applied to or extend to the back side of IPD, some portions of the underfill layer may be blocked outside the guard structure and separate from the connector region by the dam structure, while some portions of the underfill layer may be separated from the connector region by the trenches, and may fill into the trenches.

In the embodiments of the disclosure, dual-side IPD is integrated in the package structure. The package structure including the dual-side IPD may be further coupled to package substrate. The dual-side IPD has connectors disposed on both front-side and back side thereof. Therefore, the connectors (e.g., on back side) of the IPD provide extra input/output (I/O) and direct connection between the IPD and the package substrate. On the other hand, in the embodiments in which front side of the IPD faces the RDL structure of the package structure, a guard structure including dam structure(s) and/or trench(es) is formed on back side of the IPD. The guard structure is used to prevent the underfill layer creeping to connector region during dispensing process, thereby protecting the connectors on back side of the IPD from being contaminated by the underfill layer. As such, the joint issue between the connectors of the IPD and the package substrate that may be caused by underfill contamination is avoided, and the reliability of the device is thus improved.

In accordance with some embodiments of the disclosure, a package structure includes a die, an encapsulant, a first RDL structure, an IPD and an underfill layer. The encapsulant laterally encapsulates the die. The first RDL structure is disposed on the encapsulant and the die. The IPD is disposed on the first RDL structure and includes a substrate, a first connector, a guard structure and a second connector. The first connector is disposed on a first side of the substrate and electrically connected to the first RDL structure. The guard structure is disposed on a second side of the substrate opposite to the first side and laterally surrounding a connector region. The second connector is disposed within the connector region and electrically connected to a conductive via embedded in the substrate. The underfill layer is disposed to at least fill a space between the first side of the IPD and the first RDL structure. The underfill layer is separated from the connector region by the guard structure.

In accordance with some embodiments of the disclosure, an IPD includes a substrate, an interconnection structure, a first connector, a TSV, a RDL structure, a guard structure, and a second connector. The interconnection structure is disposed on a first side of the substrate. The first connector is disposed over the first side of the substrate and on the interconnection structure. The TSV is embedded in the substrate and electrically connected to the interconnection structure. The RDL structure is disposed on a second side of the substrate opposite to the first side and connected to the TSV. The RDL structure includes a dielectric layer and a redistribution layer. The redistribution layer is disposed on the dielectric layer and connected to the TSV. The guard structure is disposed in the dielectric layer and laterally surrounding a connector region. The second connector is disposed on the redistribution layer and within the connector region.

In accordance with some embodiments of the disclosure, a method of forming a package structure includes forming an IPD, electrically bonding the IPD to a package component and forming an underfill layer to fill a space between the IPD and the package component. The formation of the IPD includes: providing a substrate; forming an interconnection structure on a first side of the substrate; forming a first connector on the interconnection structure; forming a TSV in the substrate and electrically connected to the interconnection structure; and forming a RDL structure on a second side of the substrate and connected to the TSV. The formation of the RDL structure includes forming a dielectric layer, and forming a redistribution layer on the dielectric layer and connected to the TSV. The formation of the IPD further includes: forming a guard structure in the dielectric layer; and forming a second connector on the redistribution layer within a connector region laterally surrounded by the guard structure.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
    an interconnect structure comprising a stack of at least one conductive layer and at least one dielectric layer;
    a die disposed on and electrically connected to the interconnect structure;
    an integrated passive device (IPD) electrically connected to the die through the interconnect structure, wherein the IPD and the die are respectively on opposite sides of the interconnect structure, and the IPD comprises a redistribution layer (RDL) structure and a guard structure located on a side of the IPD away from the interconnect structure and surrounding a connector region, and the guard structure is disposed in a dielectric layer of the RDL structure; and
    an underfill layer disposed to at least fill a space between the IPD and the interconnect structure, wherein the underfill layer is kept outside of the connector region by the guard structure.

2. The package structure of claim 1, wherein the IPD further comprises a connector, and the connector is disposed on a redistribution layer of the RDL structure and electrically connected to the interconnect structure.

3. The package structure of claim 1, wherein the guard structure comprises a dam structure protruding from a top surface of the dielectric layer.

4. The package structure of claim 3, wherein the underfill layer further extends to cover a portion of the top surface of the dielectric layer outside the guard structure, and a topmost surface of the underfill layer is lower than or level with a top surface of the dam structure.

5. The package structure of claim 3, wherein the dam structure is isolated from the redistribution layer.

6. The package structure of claim 1, wherein the guard structure comprises a trench disposed in the dielectric layer.

7. The package structure of claim 6, wherein the underfill layer further fill into the trench, and a top surface of a portion of the underfill layer within the trench is lower than or level with a top surface of the dielectric layer.

8. The package structure of claim 6, wherein a depth of the trench is equal to or less than a thickness of the dielectric layer.

9. The package structure of claim 1, wherein the guard structure comprises a first guard ring laterally surrounding the connector region and a second guard ring laterally surrounding the first guard ring.

10. An integrated passive device (IPD), comprising:
    a substrate;
    a first connector disposed over a first side of the substrate;
    a through substrate via (TSV) embedded in the substrate and electrically connected to the first connector; and
    an RDL structure disposed on a second side of the substrate opposite to the first side and connected to the TSV, wherein the RDL structure comprises:
        a dielectric layer disposed on the second side of the substrate; and
        a redistribution layer disposed between the dielectric layer and the substrate and connected to the TSV;
    a guard structure disposed in the dielectric layer and laterally surrounding a connector region;
    a second connector disposed on the redistribution layer and within the connector region;
    wherein the guard structure comprises:
        a first trench, fully penetrating the dielectric layer; and
        a dam structure, disposed in a second trench of the dielectric layer and protruding from a top surface of the dielectric layer, wherein the second trench is different from the first trench.

11. The IPD of claim 10, wherein the first trench is unfilled and laterally surrounding the connector region.

12. The IPD of claim 10, further comprising an isolation layer disposed between the substrate and the dielectric layer, wherein the first trench extends from the top surface of the dielectric layer toward the isolation layer, and the isolation layer is disposed between the first trench and the substrate.

13. The IPD of claim 12, wherein the first trench extends to the isolation layer and exposes a portion of a top surface of the isolation layer.

14. The IPD of claim 12, wherein the first trench extends to a point over the isolation layer, and a portion of the dielectric layer is disposed between the first trench and the isolation layer.

15. The IPD of claim 10, wherein a thickness of the substrate overlapped with the guard structure is equal to a thickness of the substrate not overlapped with the guard structure.

16. The IPD of claim 10, wherein the first trench and the second trench laterally surround edges of the connector region and are laterally spaced from each other by the dielectric layer therebetween.

17. A method of forming a package structure, comprising:
    forming an IPD, comprising:
        providing a substrate;
        forming a first connector on a first side of the substrate;
        forming a TSV in the substrate and electrically connected to the first connector;
        forming an RDL structure on a second side of the substrate opposite to the first side and connected to the TSV, wherein forming the RDL structure comprises:
            forming a dielectric layer on the second side of the substrate; and
            forming a redistribution layer between the dielectric layer and the substrate and connected to the TSV;
        forming a guard structure in the dielectric layer, wherein the guard structure comprises a trench extending from a top surface of the dielectric layer to a point over the substrate; and
        forming a second connector on the redistribution layer within a connector region laterally surrounded by the guard structure;
    electrically bonding the IPD to a package component; and
    forming an underfill layer to fill a space between the IPD and the package component.

18. The method of claim 17, wherein forming the guard structure comprises:
    patterning the dielectric layer to form the trench in the dielectric layer;

forming a dam structure in the trench and protruding from the dielectric layer.

19. The method of claim 17, wherein the underfill layer is formed between the first side of the substrate and the package component, and further extends over the second side of the substrate, wherein the underfill layer is kept outside of the connector region by the guard structure.

20. The method of claim 17, wherein a thickness of the substrate overlapped with the guard structure is equal to a thickness of the substrate not overlapped with the guard structure.

* * * * *